(12) United States Patent
Nikoleris et al.

(10) Patent No.: US 10,853,262 B2
(45) Date of Patent: Dec. 1, 2020

(54) MEMORY ADDRESS TRANSLATION USING STORED KEY ENTRIES

(71) Applicant: ARM LIMITED, Cambridge (GB)

(72) Inventors: Nikos Nikoleris, London (GB); Andreas Lars Sandberg, Cambridge (GB); Prakash S. Ramrakhyani, Austin, TX (US); Stephan Diestelhorst, Cambridge (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 16/342,644

(22) PCT Filed: Nov. 29, 2017

(86) PCT No.: PCT/GB2017/053588
§ 371 (c)(1),
(2) Date: Apr. 17, 2019

(87) PCT Pub. No.: WO2018/100363
PCT Pub. Date: Jun. 7, 2018

(65) Prior Publication Data
US 2019/0243778 A1 Aug. 8, 2019

(30) Foreign Application Priority Data

Nov. 29, 2016 (GR) .............................. 20160100608
Nov. 22, 2017 (GR) .............................. 20170100521

(51) Int. Cl.
*G06F 9/26* (2006.01)
*G06F 12/1009* (2016.01)
(Continued)

(52) U.S. Cl.
CPC ...... *G06F 12/1009* (2013.01); *G06F 12/1027* (2013.01); *G11C 8/06* (2013.01);
(Continued)

(58) Field of Classification Search
CPC ............. G06F 12/1009; G06F 2212/65; G06F 2212/657; G11C 8/06; G11C 12/1027; G11C 11/4096; G11C 11/4082
See application file for complete search history.

(56) References Cited

U.S. PATENT DOCUMENTS 4,622,631 A  11/1986  Frank
4,905,188 A   2/1990  Chuang
(Continued)

OTHER PUBLICATIONS

Office Action dated Jan. 13, 2020 for co-pending U.S. Appl. No. 16/169,206, 15 pages.
(Continued)

*Primary Examiner* — Jing-Yih Shyu
(74) *Attorney, Agent, or Firm* — Nixon & Vanderhye P.C.

(57) ABSTRACT

Memory address translation apparatus comprises page table access circuitry to access a page table to retrieve translation data; a translation data buffer to store one or more instances of the translation data, comprising: an array of storage locations arranged in rows and columns; a row buffer comprising a plurality of entries and comparison circuitry responsive to a key value dependent upon at least the initial memory address, to compare the key value with information stored in each of at least one key entry and an associated value entry for storing at least a representation of a corresponding output memory address, and to identify which of the at least one key entry, if any, is a matching key entry storing information matching the key value; and output circuitry to output, when there is a matching key entry, at least the representation of the output memory address.

13 Claims, 31 Drawing Sheets

(51) Int. Cl.
  *G11C 11/408* (2006.01)
  *G06F 12/1027* (2016.01)
  *G11C 8/06* (2006.01)
  *G11C 11/4096* (2006.01)

(52) U.S. Cl.
  CPC ...... *G11C 11/4082* (2013.01); *G11C 11/4096* (2013.01); *G06F 2212/65* (2013.01); *G06F 2212/657* (2013.01)

(56) References Cited

U.S. PATENT DOCUMENTS

| | | | |
|---|---|---|---|
| 5,526,504 A * | 6/1996 | Hsu | G06F 12/1027 711/207 |
| 5,915,262 A | 6/1999 | Bridgers | |
| 5,930,833 A | 7/1999 | Yoshioka | |
| 5,946,718 A | 8/1999 | Green | |
| 5,960,463 A | 9/1999 | Sharma | |
| 6,182,266 B1 | 1/2001 | Clutter | |
| 6,349,362 B2 | 2/2002 | Luick | |
| 6,473,835 B2 | 10/2002 | Luick | |
| 6,535,949 B1 | 3/2003 | Parker | |
| 6,697,909 B1 * | 2/2004 | Wang | G06F 12/0802 365/222 |
| 6,851,070 B1 | 2/2005 | Rodrigues | |
| 8,924,832 B1 | 12/2014 | Lam | |
| 8,935,506 B1 | 1/2015 | Gopalan | |
| 9,075,928 B2 | 7/2015 | Pierson | |
| 9,081,706 B2 | 7/2015 | Koka | |
| 9,229,854 B1 | 1/2016 | Kuzmin | |
| 9,400,749 B1 | 7/2016 | Kuzmin | |
| 9,535,614 B2 | 1/2017 | Reddy | |
| 9,542,117 B2 | 1/2017 | Kunimatsu | |
| 9,779,041 B2 | 10/2017 | Aslot | |
| 10,380,033 B2 | 8/2019 | Brandt | |
| 10,445,229 B1 | 10/2019 | Kuzmin | |
| 2002/0062418 A1 | 5/2002 | Luick | |
| 2002/0065992 A1 | 5/2002 | Chauvel | |
| 2004/0019762 A1 | 1/2004 | Fukuoka | |
| 2004/0143720 A1 | 7/2004 | Mansell | |
| 2004/0143811 A1 | 7/2004 | Kaelicke | |
| 2005/0021925 A1 | 1/2005 | Clark et al. | |
| 2005/0138252 A1 | 6/2005 | Gwilt | |
| 2005/0147038 A1 | 7/2005 | Chandra | |
| 2009/0044086 A1 | 2/2009 | Craske | |
| 2009/0094192 A1 | 4/2009 | Bestgen | |
| 2011/0145510 A1 | 6/2011 | Woffinden | |
| 2011/0191543 A1 | 8/2011 | Craske | |
| 2011/0264887 A1 * | 10/2011 | Craske | G06F 9/383 711/205 |
| 2012/0008674 A1 | 1/2012 | Yamamoto et al. | |
| 2013/0205114 A1 | 8/2013 | Badam | |
| 2013/0212313 A1 | 8/2013 | Cota-Robles | |
| 2014/0115267 A1 | 4/2014 | Pierson | |
| 2014/0201494 A1 | 7/2014 | Venkumahanti | |
| 2014/0208156 A1 * | 7/2014 | Muralimanohar | G11C 8/12 714/6.24 |
| 2015/0095610 A1 | 4/2015 | Ben-Meir | |
| 2015/0143026 A1 | 5/2015 | Reddy | |
| 2015/0220436 A1 * | 8/2015 | Cooray | G06F 12/10 711/122 |
| 2015/0221358 A1 * | 8/2015 | Brandl | G11C 11/4087 365/222 |
| 2015/0355960 A1 | 12/2015 | Volvovski | |
| 2016/0048469 A1 | 2/2016 | Waugh | |
| 2016/0188690 A1 | 6/2016 | Tan | |
| 2016/0232106 A1 | 8/2016 | Chakrala | |
| 2016/0323407 A1 | 11/2016 | De los Reyes Darias | |
| 2016/0365137 A1 * | 12/2016 | Schumann | G11C 11/4093 |
| 2017/0031835 A1 | 2/2017 | Serebrin | |
| 2017/0162235 A1 | 6/2017 | De | |
| 2017/0185525 A1 | 6/2017 | Kutuva Rabindranath | |
| 2017/0286310 A1 | 10/2017 | Sukhomlinov | |
| 2019/0012110 A1 | 1/2019 | Okano | |
| 2019/0121740 A1 | 4/2019 | Kabra | |
| 2019/0171376 A1 | 6/2019 | Stephens | |

OTHER PUBLICATIONS

U.S. Appl. No. 16/169,206, filed Oct. 24, 2018, Inventor: Sandberg et al.
U.S. Appl. No. 16/169,219, filed Oct. 24, 2018, Inventor: Ramrakhyani et al.
U.S. Appl. No. 16/181,474, filed Nov. 6, 2018, Inventor: Sandberg et al.
Office Action dated Dec. 27, 2019 in co-pending U.S. Appl. No. 16/169,219, 35 pages.
International Search Report and Written Opinion of the ISA for PCT/GB2017/053588 dated Feb. 13, 2018, 15 pages.
Final Office Action dated Jun. 30, 2020 for co-pending U.S. Appl. No. 16/169,206, 46 pages.
Final Office Action dated Jul. 6, 2020 for co-pending U.S. Appl. No. 16/169,219,076 39 pages.
Office Action dated Mar. 20, 2020 for co-pending U.S. Appl. No. 16/181,474, 8 pages.
Notice of Allowance dated Jul. 9, 2020 for co-pending U.S. Appl. No. 16/181,474, 9 pages.

* cited by examiner

| Tag | Offset | ASID | VMID | Valid | Dirty |
|---|---|---|---|---|---|
| 0x01121 | 0x11 | 0 | 1 | 1 | 1 |
| 0x01122 | 0xBB | 0 | 2 | 1 | 1 |
| 0x081B4 | 0x33 | 0 | 2 | 0 | 1 |
| 0x345C1 | 0x39 | 1 | 3 | 1 | 1 |
| 0x02122 | 0xF1 | 1 | 4 | 1 | 1 |
| 0x0009D | 0xDE | 1 | 4 | 1 | 1 |
| 0x0009E | 0x07 | 2 | 5 | 1 | 0 |

Invalidate where ASID=1 or VMID=1

Non-temporal (×6)

FIG. 4

MEMORY ADDRESS TRANSLATION USING STORED KEY ENTRIES

This application is the U.S. national phase of International Application No. PCT/GB2017/053588 filed Nov. 29, 2017 which designated the U.S. and claims priorities to GR 20160100608 filed Nov. 29, 2016, and GR 20170100521 filed Nov. 22, 2017, the entire contents of each of which are hereby incorporated by reference.

BACKGROUND

This disclosure relates to memory address translation.

Memory address translation apparatus, such as management units (MMUs), attend to the translation of virtual memory addresses into physical memory addresses.

A data processing apparatus typically provides each running program with access to a virtual address space defined by virtual memory addresses. Each program sees its own virtual address space which contains instructions and data for use by that program. Amongst other established advantages, the use of virtual addressing allows the operating system to control memory access by inhibiting one program from accessing or corrupting information used by another program.

When an access is required to a virtual memory address, it is first necessary to translate the virtual memory address to a physical memory address so that the required information can be obtained from or written to the physical memory or a physical memory cache.

A cache sometimes known as a translation lookaside buffer (TLB) may be used as part of the address translation process. The TLB stores recently or commonly used translations between virtual and physical memory addresses. So, as a first step in an address translation process, the TLB is consulted to detect whether the TLB already contains the required address translation. If not, then a more involved translation process may be used, for example involving consulting so-called page tables holding address translation information, typically resulting in the TLB being populated with the required translation.

Multiple stage MMUs are used in some situations. In this arrangement, two levels of translation are in fact used. A virtual address (VA) required by an executing program or other system module such as a graphics processing unit (GPU) is translated to an intermediate physical address (IPA) by a first MMU stage. The IPA is translated to a physical address (PA) by a second MMU stage. One reason why multiple stage translation is used is for security of information handling when multiple operating systems (OS) may be in use on respective "virtual machines" running on the same processor. A particular OS is exposed to the VA to IPA translation, whereas only a hypervisor (software which oversees the running of the virtual machines) has oversight of the stage 2 (IPA to PA) translation.

SUMMARY

In an example arrangement there is provided memory address translation apparatus comprising:

page table access circuitry to access a page table to retrieve translation data defining an address translation between an initial memory address in an initial memory address space, and a corresponding output memory address in an output address space;

a translation data buffer to store, for a subset of the initial address space, one or more instances of the translation data;

the translation data buffer comprising:

an array of storage locations arranged in rows and columns;

a row buffer comprising a plurality of entries each to store information from a respective portion of a row of the array; and comparison circuitry responsive to a key value dependent upon at least the initial memory address, to compare the key value with information stored in each of at least one key entry of the row buffer, each key entry having an associated value entry for storing at least a representation of a corresponding output memory address, and to identify which of the at least one key entry, if any, is a matching key entry storing information matching the key value; and output circuitry to output, when there is a matching key entry, at least the representation of the output memory address in the value entry associated with the matching key entry.

In another example arrangement there is provided memory address translation apparatus comprising:

page table access means for accessing a page table to retrieve translation data defining an address translation between an initial memory address in an initial memory address space, and a corresponding output memory address in an output address space;

a translation data buffer means for storing, for a subset of the initial address space, one or more instances of the translation data;

the translation data buffer means comprising:

an array of storage locations arranged in rows and columns;

row buffer means comprising a plurality of entries each to store information from a respective portion of a row of the array; and comparison means responsive to a key value dependent upon at least the initial memory address, for comparing the key value with information stored in each of at least one key entry of the row buffer, each key entry having an associated value entry for storing at least a representation of a corresponding output memory address, and for identifying which of the at least one key entry, if any, is a matching key entry storing information matching the key value; and output means for outputting, when there is a matching key entry, at least the representation of the output memory address in the value entry associated with the matching key entry.

In another example arrangement there is provided a method comprising:

accessing a page table to retrieve translation data defining an address translation between an initial memory address in an initial memory address space, and a corresponding output memory address in an output address space;

storing, in a translation data buffer having an array of storage locations arranged in rows and columns, for a subset of the initial address space, one or more instances of the translation data;

buffering a plurality of entries each to store information from a respective portion of a row of the array; and comparing, in response to a key value dependent upon at least the initial memory address, for comparing the key value with information stored in each of at least one key entry of the row buffer, each key entry having an associated value entry for storing at least a representation of a corresponding output memory address;

identifying which of the at least one key entry, if any, is a matching key entry storing information matching the key value; and outputting, when there is a matching key entry, at least the representation of the output memory address in the value entry associated with the matching key entry.

Further respective aspects and features of the present technology are defined by the appended claims.

BRIEF DESCRIPTION OF THE DRAWINGS

The present technique will be described further, by way of example only, with reference to embodiments thereof as illustrated in the accompanying drawings, in which:

FIG. 4 illustrates a maintenance operation in accordance with some embodiments;

DESCRIPTION OF EMBODIMENTS

Figure 1:
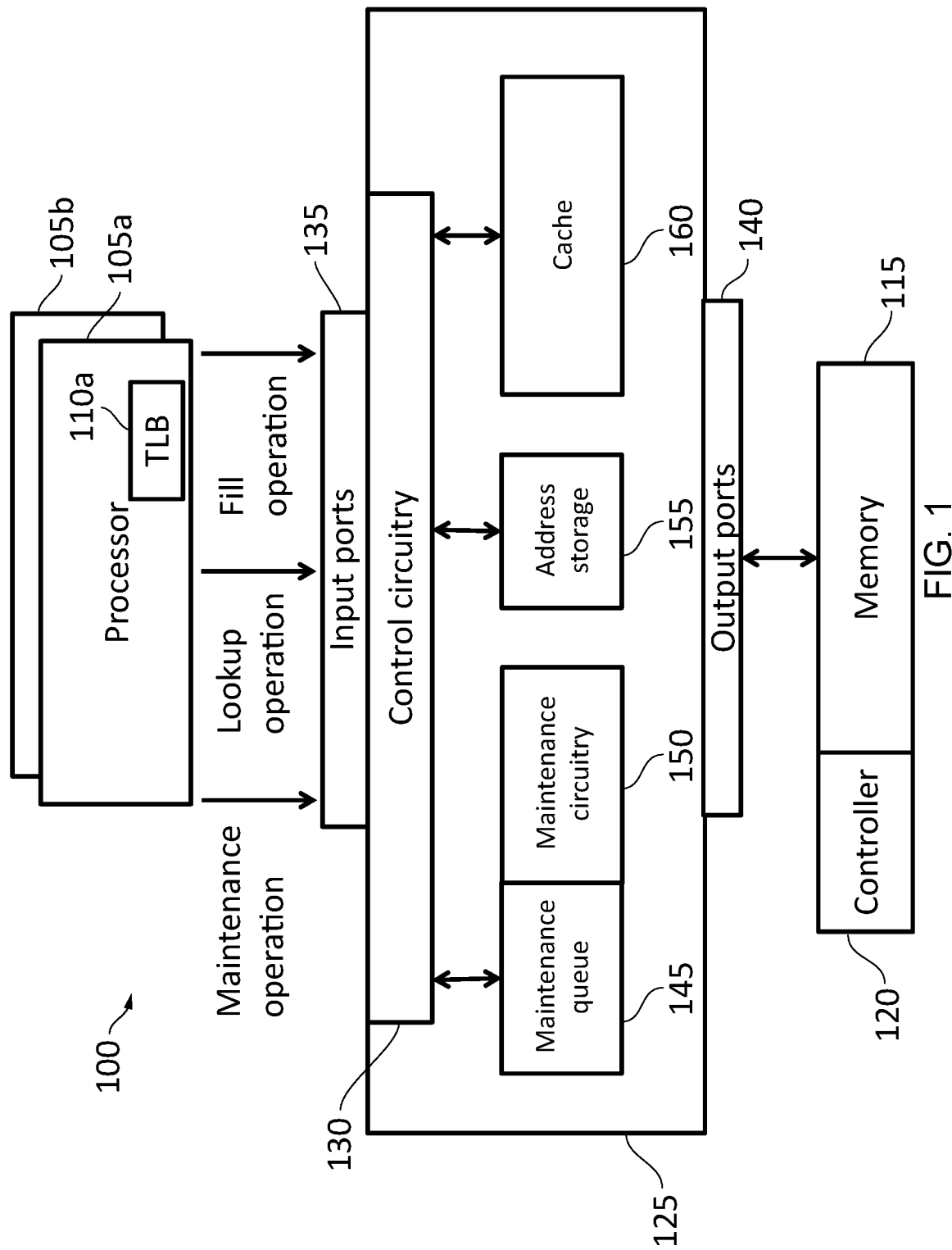
FIG. 1 illustrates an apparatus in accordance with some embodiments.

This description relates to a number of potentially orthogonal techniques, which may be used together in any combination. FIG. 1 illustrates an example apparatus 100 in which all the techniques to be discussed below are used simultaneously. The apparatus includes a plurality of processors 105a, 105b . . . , each having a dedicated Translation Lookaside Buffer 110a, 110b, . . . for the translation of an input address to an output address in an output space. Each processor is able to send maintenance operations, lookup operations, and fill operations to an interconnect 125 via one or more input ports 135. Each of these operations relates to address storage 155 (which can act as a translation data buffer) associated with the interconnect 125. The lookup operations comprise an input or initial address for which an output address in an output space is to be provided. The fill operations are used to provide such translations. Meanwhile, a maintenance queue 145 stores the maintenance operations, which are performed asynchronously by the maintenance circuitry 150 on the address storage 155 so that the processor 105a need not wait for the maintenance operations to be performed. The address storage 155 may take the form of circuitry to access a further TLB, for which the translation data may actually be stored in the memory 115 and which can also access the memory 115 for so-called page table walks to populate the address storage. The interconnect 125 provides a connection to a main memory 115 via one or more output ports 140. The main memory is controlled via a controller 120. Data read from or to be written to the main memory 115 can be stored in a cache 160, which is associated with the interconnect 125. By providing a cache, the processors 105a, 105b, . . . can access data from the memory 115 more quickly than if a request has to be sent out of the interconnect 125 and handled by the memory controller 120. Storage from the cache 160 can be 'stolen' (temporarily or otherwise reallocated) for use by the address storage 155 so that the amount of storage available for storing address translations can be increased beyond the capacity of the address storage 155 itself. The management of the stolen storage, as well as the operation of the maintenance queue 145, address storage 155, and cache 160 is handled by the control circuitry 130. The control circuitry can control the timing of page table walks and TLB accesses so that for a particular translation request from the TLB 110a, the page table walk can be initiated before completion of a TLB lookup. The controller 120 and the control circuitry 130 can cooperate to oversee the storage in and retrieval from the memory 115 of translation data in the form of key-value pairs such that in some examples multiple such pairs can be stored in a single row of memory cells (accessible by a row buffer (not shown) of the memory 115) of the memory 115.

Note that the main memory 115 and the cache 160 itself could be implemented by using DRAM.

Asynchronous Maintenance

Figure 2:
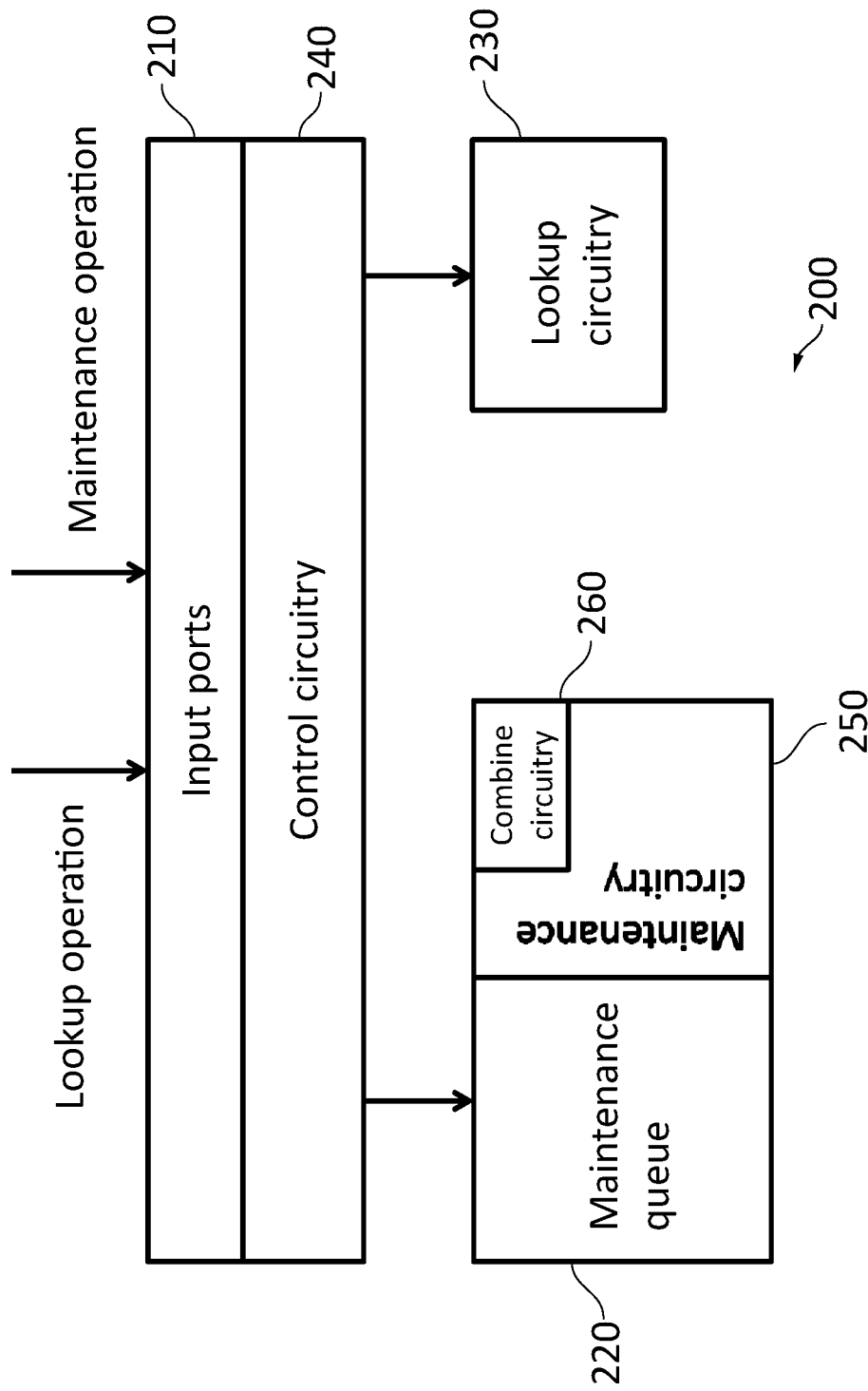
FIG. 2 illustrates an apparatus in accordance with some embodiments.

FIG. 2 illustrates an example of an apparatus 200 in accordance with some embodiments. This apparatus comprises a set of inputs ports 210, which provide lookup operations and maintenance operations (collectively referred to as 'requests') to a control circuitry 240. Lookup operations having the input address (lookup requests) are passed to the lookup circuitry 230, which could for instance take the form of a Translation Lookaside Buffer (TLB). In some embodiments, the TLB could be provided via DRAM. Maintenance operations (maintenance requests) are passed to a maintenance queue 220. Such apparatus 200 may be used for providing asynchronous maintenance in a storage system and is provided as an example of an apparatus 200 comprising an input port 210 to receive, from a requester, any one of: a lookup operation comprising an input address, and a maintenance operation; maintenance queue circuitry 220 to store a maintenance queue of at least one maintenance operation; and address storage (for example, implemented by the lookup circuitry 230) to store a translation between the input address and an output address in an output address space, wherein in response to receiving the input address, the output address is provided in dependence on the maintenance queue; and in response to storing the maintenance operation, the maintenance queue circuitry causes an acknowledgement to be sent to the requester.

In such embodiments, the requester may take the form of a processor such as a Central Processing Unit (CPU). Via the input port 210 of the apparatus 200, the requester is able to issue a lookup operation comprising an input address. The requester can also issue a maintenance request via the input port 210. For example, the maintenance operation could be directed towards the maintenance of entries in lookup circuitry 230, which stores translations between input addresses and output addresses in an output address space. The output address in an output address space could take the form of a physical address (PA) or an intermediate physical address (IPA). An IPA can be used to partially translate between virtual address (VA) and physical address (PA), for example.

Two further operations enable the apparatus 200 to asynchronously perform maintenance operations. Firstly, in response to a maintenance operation being received, the maintenance operation is stored and the maintenance queue circuitry 220 causes an acknowledgement to be sent back to the requester. This acknowledgement is sent immediately (e.g. without waiting for the maintenance operation to be completed). Consequently, the requester is not stalled or blocked until the maintenance operation is performed. However, since the maintenance operation is not performed straight away, it is necessary for the lookup circuitry 230 to inhibit stale data from being provided. In other words, the apparatus 200 must continue to behave as if the maintenance operation has been performed.

Secondly, in response to receiving an input address (i.e. an address to be translated), the corresponding output address is provided in dependence on the queue maintained by the maintenance queue circuitry 220. Again, this is necessary to prevent the return of data that would not be returned if queued maintenance operations have been performed. Each of these processes is discussed in more detail with reference with FIGS. 3A and 3B, below.

The circuitry in FIG. 2 also provides an example of: control circuitry 240 to scan the maintenance queue for a conflict with the input address in response to receiving the input address, wherein the output address is provided independence on the queue by returning a miss if there is a conflict and providing the output address otherwise.

A conflict can occur when the input address provided at the input port 210 relates to an address that would be affected by a maintenance operation held in the maintenance queue 220. In other words, if the maintenance operations being held in the maintenance queue 220 had been performed, then a different result for the input address would be stored in the lookup circuitry 230. As a consequence of such a conflict occurring, and in order to prevent stale data from being returned, a TLB miss is provided in response to the input address. This will in turn cause a page walk process to begin, during which the correct output address is retrieved. If there is no conflict, then the output address can be provided.

FIG. 2 also shows an example of maintenance circuitry 250 to cause a selected maintenance operation to be performed from the maintenance queue. There are a number of ways in which the maintenance circuitry 250 could select a maintenance operation and to cause a selected maintenance operation to be performed from the queue maintained by the maintenance queue circuitry 220. In some embodiments, the maintenance circuitry 250 selects a maintenance operation to be performed when the lookup circuitry 230 is otherwise unengaged. For example, if there is a period of time for which no input address is received at the input ports 210, then the maintenance circuitry 250 could take advantage of this downtime in order to cause one or more of the maintenance operations to be performed. In some embodiments, the maintenance circuitry 250 may continually cause maintenance operations to be selected from the maintenance queue 220 and performed until there are none left. In some embodiments, maintenance operations are scheduled to be performed if a period of time has elapsed since they were added to the maintenance queue 220 or when the maintenance queue 220 is full. Other techniques of queue selection will be known to the skilled person.

FIG. 2 also illustrates an example of combine circuitry 260 to combine a plurality of entries in the maintenance queue based on one or more conditions. Such a process is discussed in more detail with reference to FIG. 7.

Figure 3B:
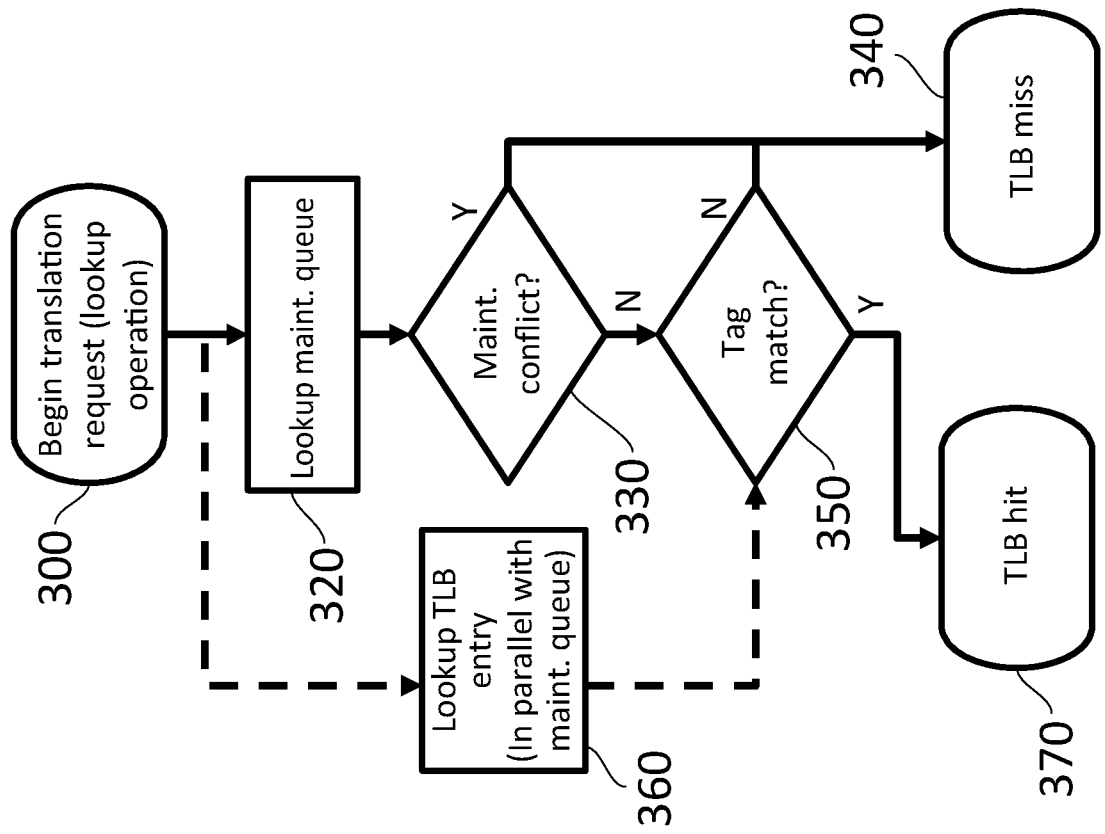
FIGS. 3A and 3B collectively demonstrate how different requests are distributed by the CPU in accordance with some embodiments.
Figure 3A:
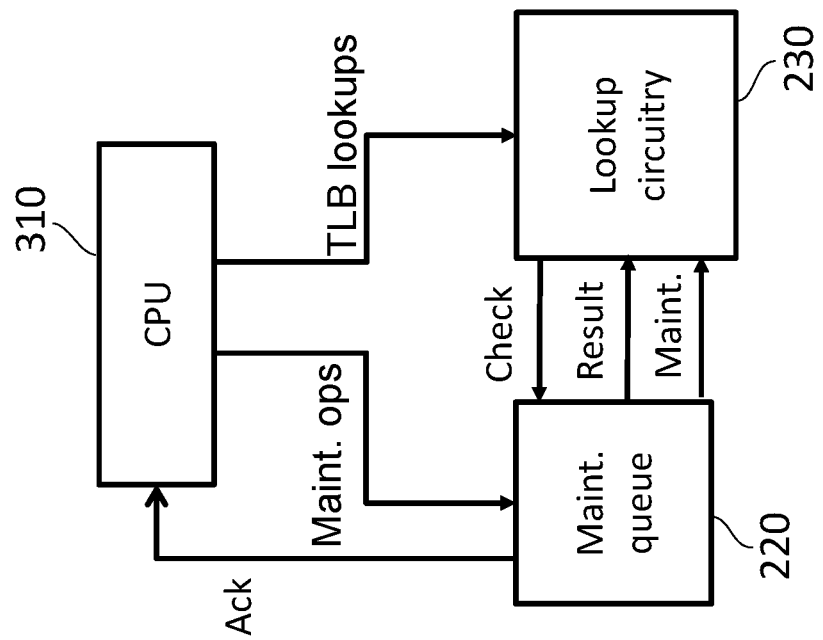

FIGS. 3A and 3B collectively illustrate the process of handling an incoming lookup operation comprising the input address. As previously mentioned, the corresponding output address in the output address space (e.g. a physical address space or a partial/intermediate address space) is provided in dependence on the maintenance queue. FIGS. 3A and 3B are discussed simultaneously.

The process begins at step 300, where a lookup operation, e.g. from a virtual address to a physical address, is received. This occurs from a requester such as a CPU 310 being sent to lookup circuitry 230. This may take the form of a TLB lookup. At a step 320 the lookup circuitry 230 accesses and looks up the maintenance queue 220. It is then determined, at a step 330, whether there is a conflict in the maintenance queue 220 with the TLB lookup. If the result from the maintenance queue 220 to the lookup circuitry 230 indicates that such a conflict exists, then at a step 340, the lookup circuitry 230 issues a TLB miss. This causes a page walk to occur, which in some embodiments is initiated either by the CPU 310 or by a special circuit known as a page table walker, in order to retrieve the physical address. If, however, at step 330, the result issued by the maintenance queue 220 to the lookup circuitry 230 indicates that no conflict exists, then at step 350 it is determined whether there is a tag match. In parallel with checking whether there is a conflict, a lookup is performed at the TLB in step 360 and relevant entries then have tags checked in step 350. The tag match process determines whether there is a corresponding output address given the input address in the lookup circuitry 230. In practice, this commonly occurs by matching a part of the input address (referred to as the tag) with an entry in the lookup circuitry 230. If such a tag is not found, then the process proceeds to step 340 where a TLB miss is issued back to the CPU 310 or page walker circuit. Alternatively, if a matching tag is found, then at step 370 the corresponding output address is provided back to the CPU 310. As shown in FIG. 3A, when the CPU 310 issues a maintenance operation, this is issued to the maintenance queue 220. When, for example, the lookup circuitry 230 is otherwise idle, the maintenance queue 220 can select a maintenance operation to be performed. This is then performed on the set of translations stored by the lookup circuitry 230. Note that an acknowledgement is sent by the maintenance queue 220 in response to the maintenance operation being issued by the CPU 310. Accordingly, the CPU 310 need not block or stall as a consequence of issuing the maintenance operation and waiting for that maintenance operation to be performed. Instead, it is possible for the maintenance operation to be queued and then performed at a convenient time. These figures therefore provide an example of a method comprising receiving 300, from a requester, any one of: a lookup operation comprising an input address, and a maintenance operation; storing a maintenance queue 220 of at least one maintenance operation; and storing a translation between the input address and an output address in an output address space, wherein in response to receiving the input address, the output address is provided in dependence on the maintenance queue 220; and in response to storing the maintenance operation, causing an acknowledgement to be sent to the requester.

FIG. 4 illustrates a maintenance operation in accordance with some embodiments. In particular, FIG. 4 illustrates an example in which the maintenance operation accesses a plurality of translations in the address storage (for example the lookup circuitry 230. FIG. 4 also illustrates an example in which the maintenance operation sequentially accesses translations in the lookup circuitry 230 and an example in which the address storage is adapted to be memory mapped; and the maintenance operation accesses translations in the lookup circuitry 230 using non-temporal accesses.

A non-temporal access is one in which a new entry is not installed in a cache as a consequence of that access. For example, as a result of the non-temporal accesses, no entry is stored in the Last Level Cache (LLC). Such an action avoids adding unnecessary data to the cache as a consequence of a maintenance operation. There is therefore an assumption that the data is not going to be used again in the near future and so should not evict other useful data (and should not be cached). In some embodiments, rather than using a non-temporal access, a regular access is used and any resulting entry added to the cache is given a high replacement priority such that the entry will be replaced more easily.

FIG. 4 illustrates an example in which the maintenance operation is an invalidation operation. In some embodiments, an invalidation operation causes the valid flag of one or more entries in the table is made (e.g. cleared) to indicate that the entry is no longer usable. Accordingly, those entries can be replaced by other entries as required. In some other embodiments, the invalidation operation could cause entries to be deleted altogether.

FIG. 4 also illustrates an example in which the invalidation operation is to invalidate one or more translations in the lookup circuitry 230 based on one or more of: a virtual address, a range of virtual addresses, an address space identifier, a virtual machine identifier, an intermediate physical address, and a physical address. The invalidation could therefore use one or more (any combination) of such parameters in order to indicate those entries that should be subject to the invalidation. In some embodiments, other parameters could be used in addition (or instead).

In this specific example, the invalidation operation is to invalidate entries where the address space identifier (ASID) or the virtual machine identifier (VMID) is 1. This is achieved by scanning through each entry in the address storage, checking the value of ASID and VMID for any entry that is equal to 1. Where such an entry is found, the valid flag for that entry is cleared to indicate that the entry is no longer valid. In the example of FIG. 4, this is achieved by setting the valid flag to zero (invalid). It will be appreciated that invalidation operations can be performed based on other fields. Note that the field need not be in the table itself but could be associated with an entry in the table via another table, register, or flag. The address space identifier and the virtual machine identifier are both techniques that are used in order to divide up entries of the table into groups. In particular, a virtual machine identifier (VMID) may be used to identify entries that belong to a particular virtual machine instance in a system having a number of virtual machines. Similarly, address space may be segmented into a number of sections with each section having its own identifier. These techniques can even be combined so that each virtual machine can separate its available memory into a number of different segments in dependence on that virtual machine. For example, each address space could be allocated to a different application running on a particular virtual machine instance. In this way, each entry in the lookup circuitry 230 can be associated with a particular purpose. An invalidation operation can therefore be targeted at addresses associated with a particular purpose. For example, an invalidation operation could be performed in respect of all addresses associated with a particular application running on a particular virtual machine when, for instance, that application terminates. Similarly, an invalidation operation could be targeted based on simply a virtual machine identifier, if that virtual machine were to be terminated for instance.

It will be appreciated from the above paragraphs that the maintenance operation can be time consuming. Accordingly, by using the apparatus 200 described with reference to FIGS. 2, 3A and 3B, it is possible to asynchronously perform maintenance such that a requester such as a CPU need not be blocked or stalled while the maintenance operation is performed. It is particularly important when the storage on which the maintenance operations are being performed is particularly large. Since the maintenance operations are not performed immediately, it is necessary to resolve conflict that can occur between lookups and the queued maintenance operations. This can be achieved by testing for such conflict, and where a conflict is detected, causing the original data to be retrieved (e.g. by issuing a TLB miss causing a page walk to be performed). In this way, a queue of maintenance operations can be maintained, and performed when appropriate.

Improving Asynchronous Maintenance Efficiency by Simultaneously Performing Multiple Maintenance Operations FIG. 4 illustrates an example in which the selected maintenance operation comprises scanning through at least some of the lookup circuitry 230 and performing an action in response to a condition being met; during the scanning, the maintenance circuitry 250 performs a further action in response to a further condition being met; and the further action and the further condition correspond with a further maintenance operation to be performed from the maintenance queue.

In this particular example, it can be considered that a first maintenance operation exists for invalidating where an ASID is 1. There may be a second maintenance operation to perform invalidation where the VMID is 1. Rather than performing a first scan through each of the entries in the lookup circuitry 230 for entries where an ASID is 1, then performing a second scan through each of the entries of the lookup circuitry 230 for where the VMID is 1. A single scan can be performed where each entry is checked to determine whether its value of ASID or VMID is 1. In this way, only a single scan through the entries of the lookup circuitry 230 is required and this can be used to reduce the overhead of the maintenance operations. Accordingly, multiple maintenance operations can be performed more efficiently. It will be appreciated that the action and the further action could be the same. Similarly, the condition and the further condition could also be the same.

Figure 5:
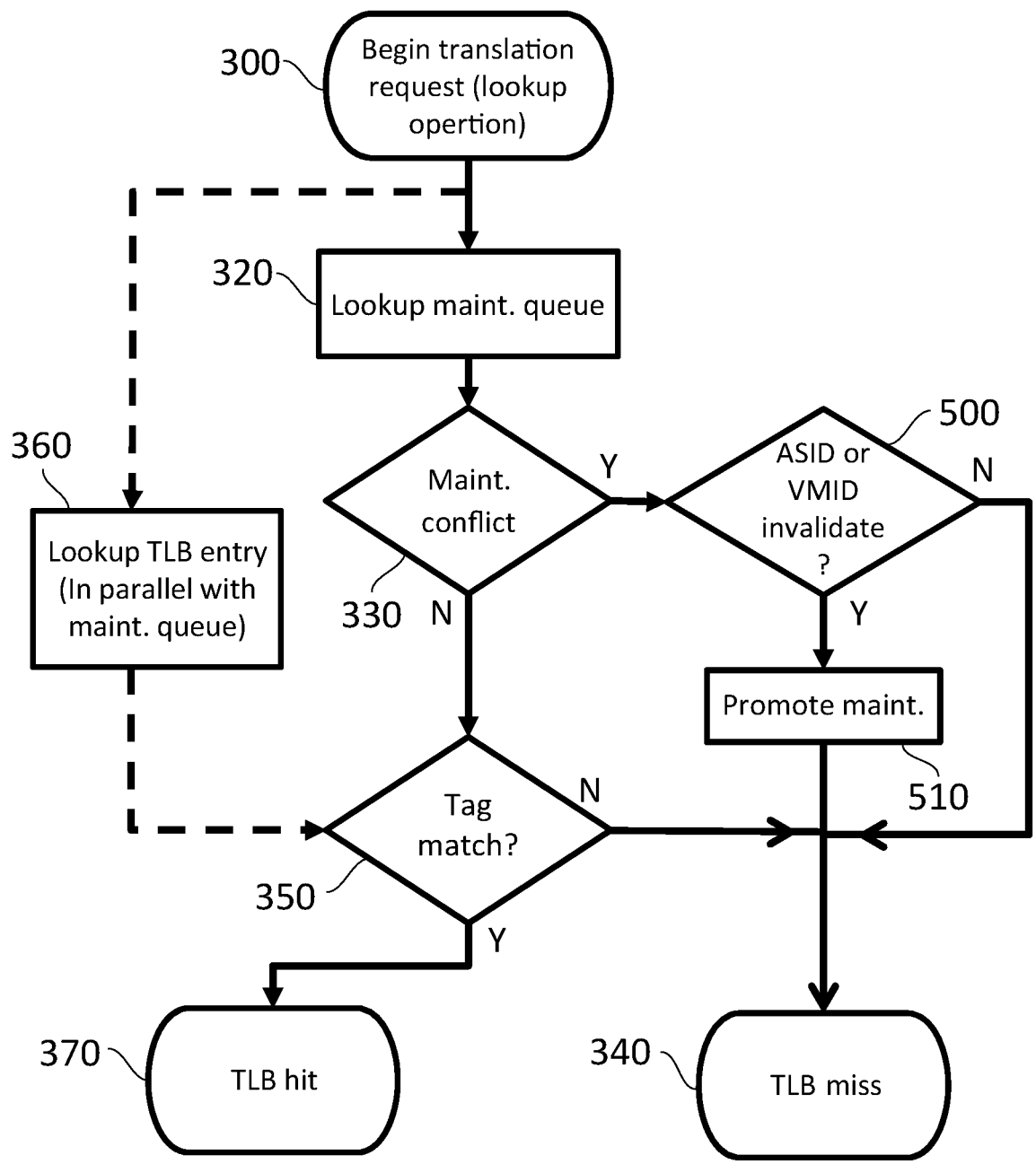
FIG. 5 illustrates a process of handling overlapping requests.

Improving Asynchronous Maintenance Efficiency by Recognising Reuse of ASID or VMID FIG. 5 illustrates an example in which in response to the input address relating to an entry in the lookup circuitry 230 that has an overlap with an overlapping maintenance operation in the maintenance queue, the apparatus 200 is adapted to prioritise the overlapping maintenance operation.

When a particular application or virtual machine ends, the TLB entries having an ASID value associated with that application, or VMID value associated with that virtual machine must be invalidated. If requests for the same ASID/VMID start to get received, it means that the TLB will have to be filled with new entries. However, this cannot happen before the maintenance operation is performed. Hence, when a lookup operation (e.g. a translation request) overlaps with such a maintenance operation, it may be desirable to promote the maintenance operation.

FIG. 5 illustrates a flowchart that is similar to the flowchart presented in FIG. 3B, which has been adjusted for this improvement. The process proceeds as described in relation to FIG. 3B. However, at step 330, if a maintenance conflict is detected, then at step 500 it is determined whether the maintenance operation that the conflict occurs with is an invalidation directed towards a particular ASID or VMID. If not, then the process proceeds to step 340 as before where a TLB miss is issued. Otherwise, at step 510 the maintenance operations priority is promoted. This causes the maintenance operation to be performed more quickly. In some embodiments, the priority of the maintenance operation is promoted to a highest level so that it is the next maintenance operation to be performed. The process then proceeds to step 340 where a TLB miss is performed, thereby resulting in a page walk.

Figure 6:
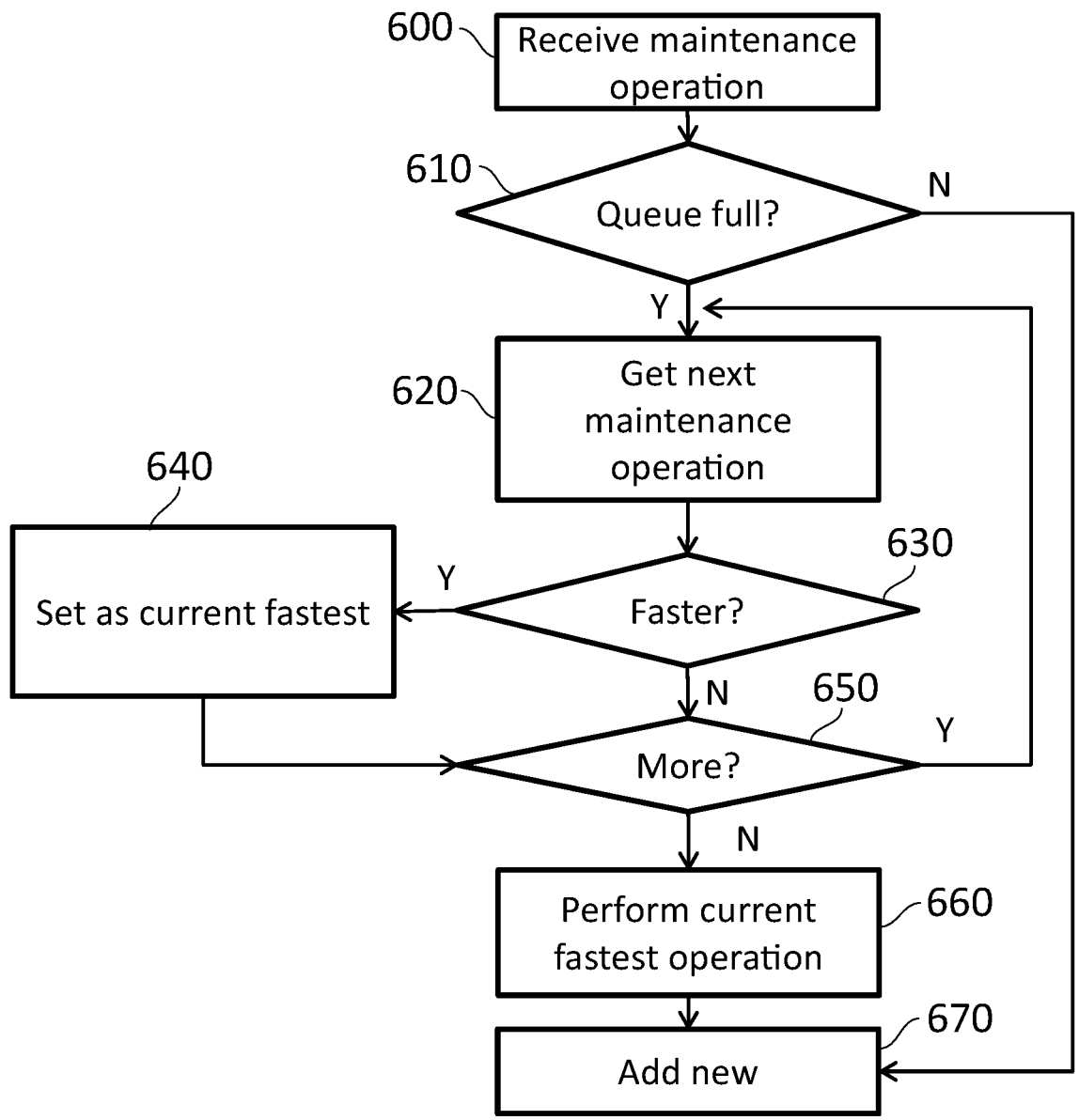
FIG. 6 illustrates a process of receiving a new maintenance operation in accordance with some embodiments.

Improving Asynchronous Maintenance Efficiency by Responding to a Full Maintenance Queue The flowchart in FIG. 6 relates to examples in which in response to receiving the maintenance operation when the maintenance queue is full, the maintenance circuitry is adapted to perform the selected maintenance operation. In particular, FIG. 6 relates to examples in which the selection is based on a maintenance operation in the maintenance queue that will take the least time to be performed.

In some instances, a maintenance operation may be received when the queue of maintenance operations 220 is already full. In such a case, the requester could be blocked or stalled until such time as the space is available within the queue 220. One way to handle this is for the maintenance circuitry 250 to immediately perform one of the maintenance operations held in the maintenance queue 220 for instance, in some embodiments, the maintenance circuitry 250 selects the fastest maintenance operation from the maintenance queue 220 to be performed and immediately performs that operation. For example, as shown in FIG. 6 at step 600, a maintenance operation is received. At step 610 it is determined whether the maintenance queue 220 is full or not. If not, then the process proceeds to step 670 where the new maintenance operation is added to the queue. Otherwise, at step 620, a loop begins in which the next maintenance operation of the maintenance operations held within the maintenance queue 220 is fetched. At step 630 it is determined whether this maintenance operation is faster than the fastest maintenance operation that has been determined so far. As a default, if no maintenance operation has yet been examined, then this will be true. In any event, if this condition is met, then at step 640 the current maintenance operation that is being examined is set as the current fastest operation. The process then proceeds to step 650 if the current maintenance operation being examined is not faster at step 630 then the process proceeds directly to step 650. At step 650 it is determined whether there are more maintenance operations to be examined from the maintenance queue 220. If so, then the process proceeds back to step 620 where the next maintenance operation is fetched. Otherwise, at step 660, the current fastest operation is performed. The newly received maintenance operation that was received in step 600 is then added to the maintenance queue 220 at step 670.

Figure 7:
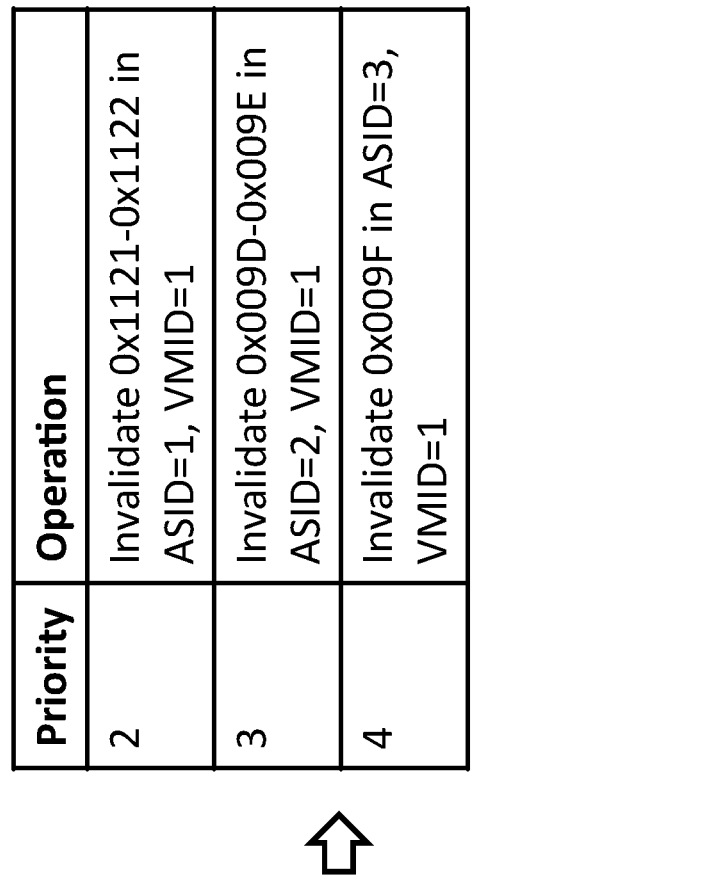
FIG. 7 illustrates the combining of maintenance operations in accordance with some embodiments.

Improving Asynchronous Maintenance Efficiency by Combining Maintenance Operations FIG. 7 illustrates an example of combine circuitry 260 to combine a plurality of entries in the maintenance queue based on one or more conditions. For example, in some embodiments, the combine circuitry 260 combines adjacent addresses in the lookup circuitry 230. For example, entries that relate to the same ASID and VMID where the address is adjacent. In this manner, the queue of maintenance operations can be compacted by replacing a plurality of entries that relate to adjacent addresses with a single entry relating to a range of addresses.

In some embodiments, the one or more conditions include: (i) overlapping or adjacent VA/IPA regions can be merged; (ii) invalidate by VA is subsumed by an overlapping invalidate by ASID if the VA belongs to the ASID; (iii) invalidate by IPA is subsumed by an overlapping invalidate by VMID if the IPA belongs to the VMID; and (iv) invalidate by ASID is subsumed by an invalidate by VMID if the ASID belongs to the VMID. These conditions are based on the relationship that a VA has an associated ASID, that an ASID has an associated VMID, and that an IPA has an associated VMID.

Considering the example of FIG. 7, the queue initially has five operations. The first two operations can be merged into a single operation, because they relate to the same ASID (1) and the same VMID (1) and the addresses are adjacent (0x1121 is adjacent to 0x1122). Condition (i) therefore applies. These operations can therefore be replaced by a single invalidation operation, which is directed to invalidate the addresses within the range 0x1121 to 0x1122 where the ASID is 1 and the VMID is 1. Similarly, the next two operations of the initial maintenance operation queue are also directed to the same ASID (2) and VMID (1) and also relates to adjacent addresses (0x009D is adjacent to 0x009E). Accordingly, these can be compacted in order to produce a single maintenance operation to invalidate the range 0x009D to 0x009E for an ASID of 2 and a VMID of 1. Accordingly, the compacted maintenance queue has three entries. In this example, each of the maintenance operations associated with a priority. In this example, the priority of the new entry is equal to the highest of the priorities of the maintenance operations that were combined. In this way, a maintenance operation does not decrease in priority as a consequence of being combined with other operations. In other embodiments, the priority could be averaged between all of the operations that make up the new operation. It will be appreciated that other options are available and will be known to the skilled person.

Accordingly, it can be seen that the maintenance queue 220 can be compacted, thereby allowing further maintenance operations to be added to the maintenance queue 220 without the requester having to be stalled or blocked. The compacting process does not cause any maintenance operation to be lost. The combining process merely amalgamates entries together.

Improving Asynchronous Maintenance Efficiency by Use of a Fill Queue

Figure 8:
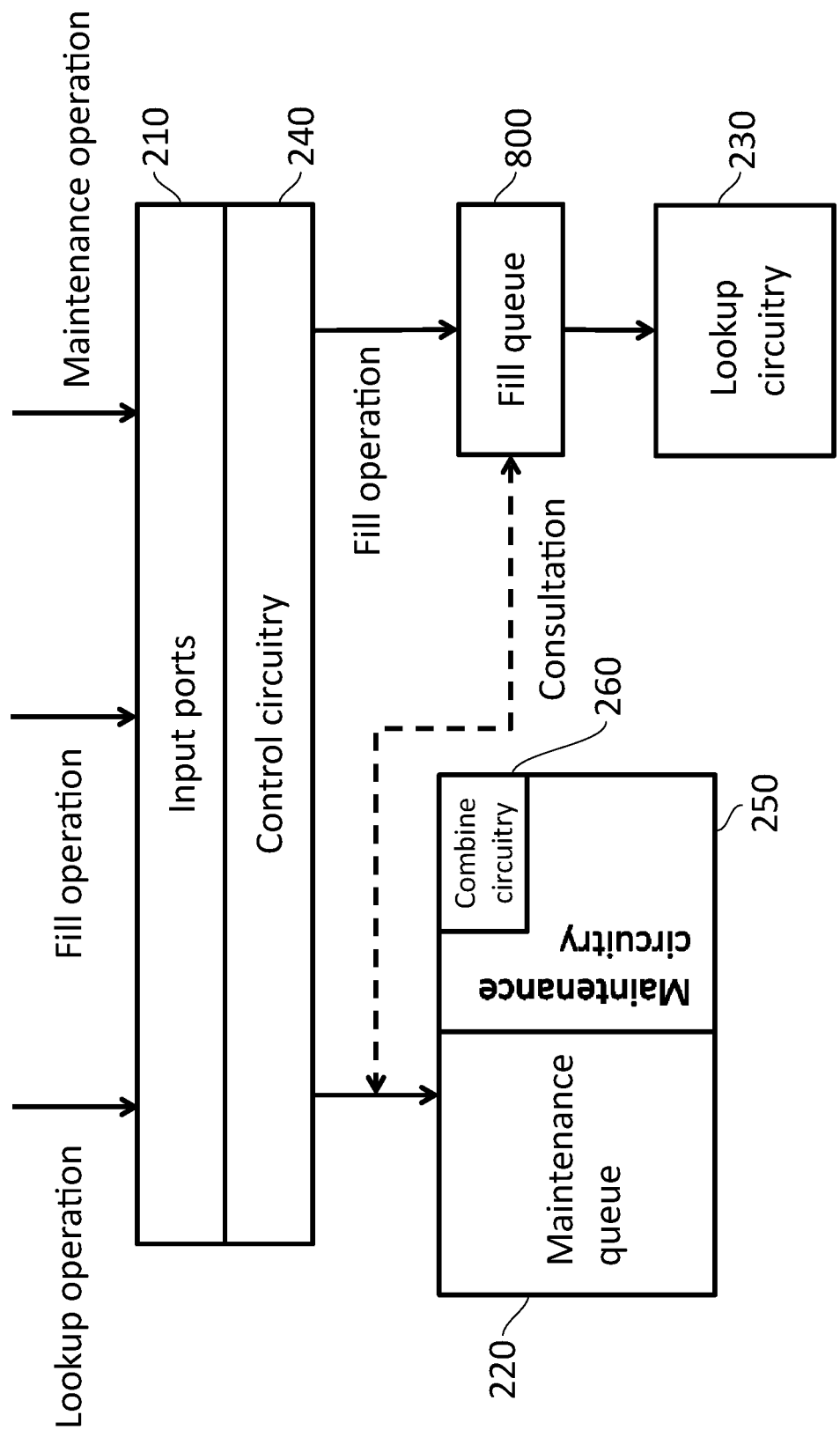
FIG. 8 illustrates the use of a fill queue in accordance with some embodiments.

FIG. 8 illustrates an example of fill queue circuitry 800 to store at least one fill operation for a new translation in the lookup circuitry 230, wherein the input port 210 is adapted to receive the fill operation; and in response to the fill operation having at least some overlap with an overlapping maintenance operation in the maintenance queue, the fill queue circuitry 800 stores the fill operation, and if the fill operation fully overlaps the maintenance operation, the maintenance operation is removed from the maintenance queue, otherwise a priority of the overlapping maintenance operation is increased.

When a new entry is to be added to the lookup circuitry 230, for instance when a page table walk has occurred, there may be a conflict with a pending maintenance operation. One example of where this could occur is where a maintenance operation is directed to perform an invalidate according to a particular ASID followed by a fill which will fill in a specific mapping. In another example, an invalidate according to a particular VA and a fill for the same VA could be issued at similar times. In this case, the invalidate can be dropped and the entries can be filled in directly.

By providing a fill queue 800 into which the fill operation can be stored, the fill operation can be delayed until such time as the conflicting maintenance operation is handled. In order to cause the maintenance operation that is conflicting to be resolved more quickly, a priority of the conflicting (i.e. overlapping) maintenance operation can be increased. As shown in FIG. 8, when a fill operation is received, it is initially sent to the fill queue 800. Where the lookup circuitry 230 takes the form of a TLB, the fill queue 800 could itself take the form of a smaller TLB. Here, consultation occurs with the maintenance queue in order to determine whether the operation can proceed directly to the lookup circuitry 230 or whether the operation must be held at the fill queue 800. The process of making this determination is shown in more detail with respect to FIG. 9. Once the conflicting maintenance operations have been completed, any entries that conflicted with that maintenance operation are promoted from the fill queue 800 to the lookup circuitry 230. Similarly, maintenance operations entering the maintenance queue 220 consult with the fill queue 800 in order to ensure that existing fill operations are effected by the maintenance operation. In some embodiments, the maintenance operation may not be able to proceed until such time as the fill operation has been performed. Similarly, when an input address is provided as part of a lookup operation, this may be checked against the fill queue 800 as well as the lookup circuitry 230.

Figure 9:
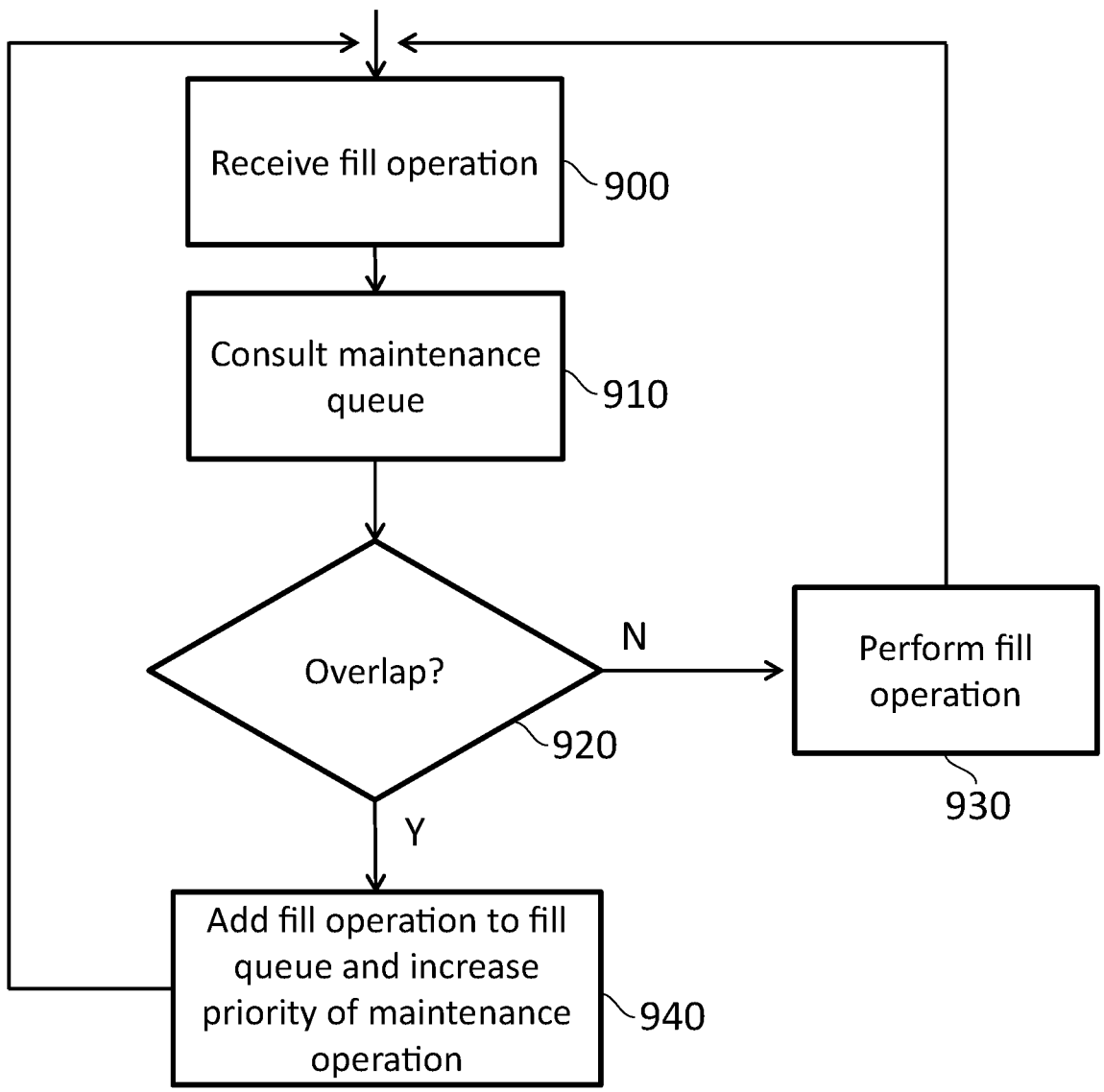
FIG. 9 shows, in flowchart form, the process of consulting against the fill queue, in accordance with some embodiments.

FIG. 9 illustrates an example of the consultation process that occurs from the fill queue 800 for instance, the maintenance queue 220. At a step 900, a fill operation is received. At step 910, the maintenance queue 220 is consulted. At step 920, it is determined whether there is an overlap between any of the entries in the maintenance queue and the fill operation. For example, it may be determined whether any of the maintenance operations have the potential to affect the fill operation that has been received. If no such overlap exists, then at step 930 the fill operation is performed. This causes one or more entries of the lookup circuitry 230 to be updated. The process then proceeds back to step 900. Alternatively, if an overlap is detected then the fill operation is added to the fill queue 800 and the priority of the conflicting maintenance operation is increased at step 940. Again, the process then returns to step 900.

Figure 10A:
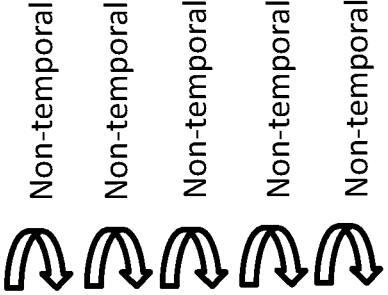
FIG. 10A demonstrates a first process of performing a fill operation and a maintenance operation in accordance with some embodiments.
Figure 10A:

This process is illustrated in FIG. 10A in which a maintenance operation is performed followed by the fill operation. In this example, it is assumed that the maintenance operation does not result in any of the entries in the lookup circuitry 230 being affected. However, having performed the maintenance operation, the fill operation, which is subsequently performed, results in the addition of a new entry shown in bold.

Figure 10B:
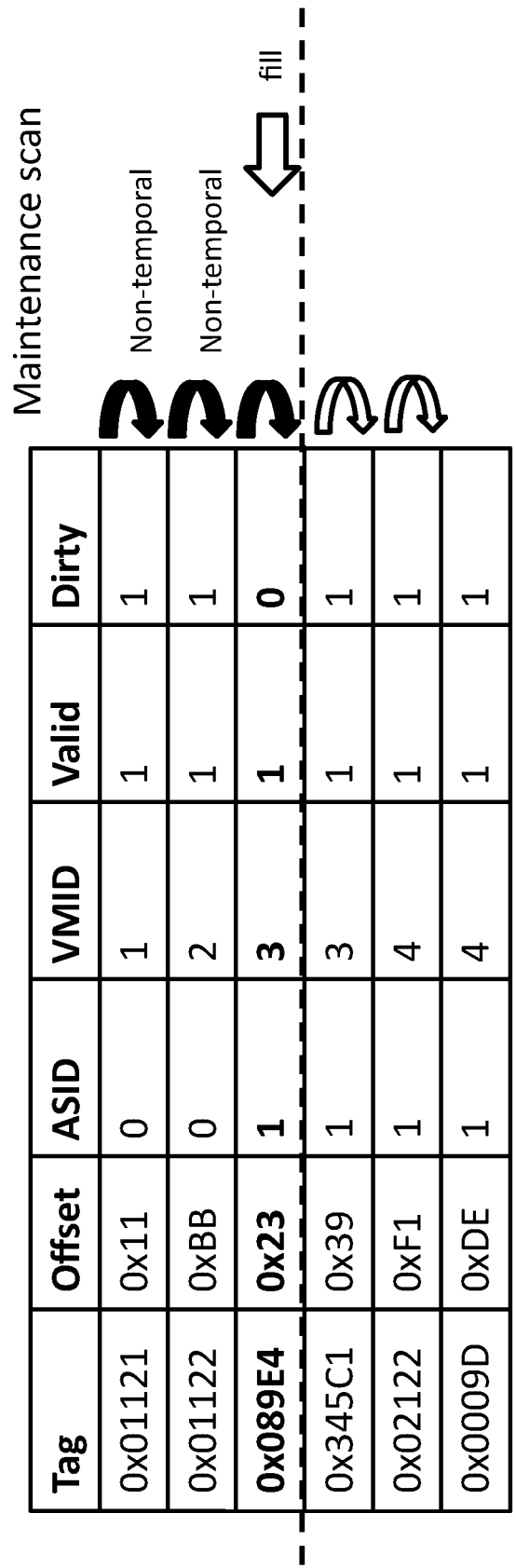
FIG. 10B demonstrates a second process of performing a fill operation and a maintenance operation in accordance with some embodiments.

FIG. 10A therefore illustrates an example whereby in response to the overlapping maintenance operation being completed (e.g. as part of the entries being scanned), the fill operation is performed on the lookup circuitry 230. As an alternative, FIG. 10B illustrates an example in which the fill operation is performed on the lookup circuitry 230 as the maintenance operation is performed. In particular, the maintenance operation scans through the entries of the lookup circuitry 230. After performing the maintenance operation on the location at which the fill operation would cause a new entry to be inserted, the fill operation is performed, thereby inserting the new entry. The remainder of the maintenance operation can then be performed on the remaining entries. In this way, the maintenance operation does not affect the fill operation, since the fill operation occurs after the maintenance operation has affected the entry at which the fill operation will occur. This approach benefits from the principal of locality in that multiple operations are performed on the same space in storage at the same time. This can avoid the need to rescan through each of the entries of the lookup circuitry 230 in order to locate the entry at which the fill operation will be performed.

Figure 11:
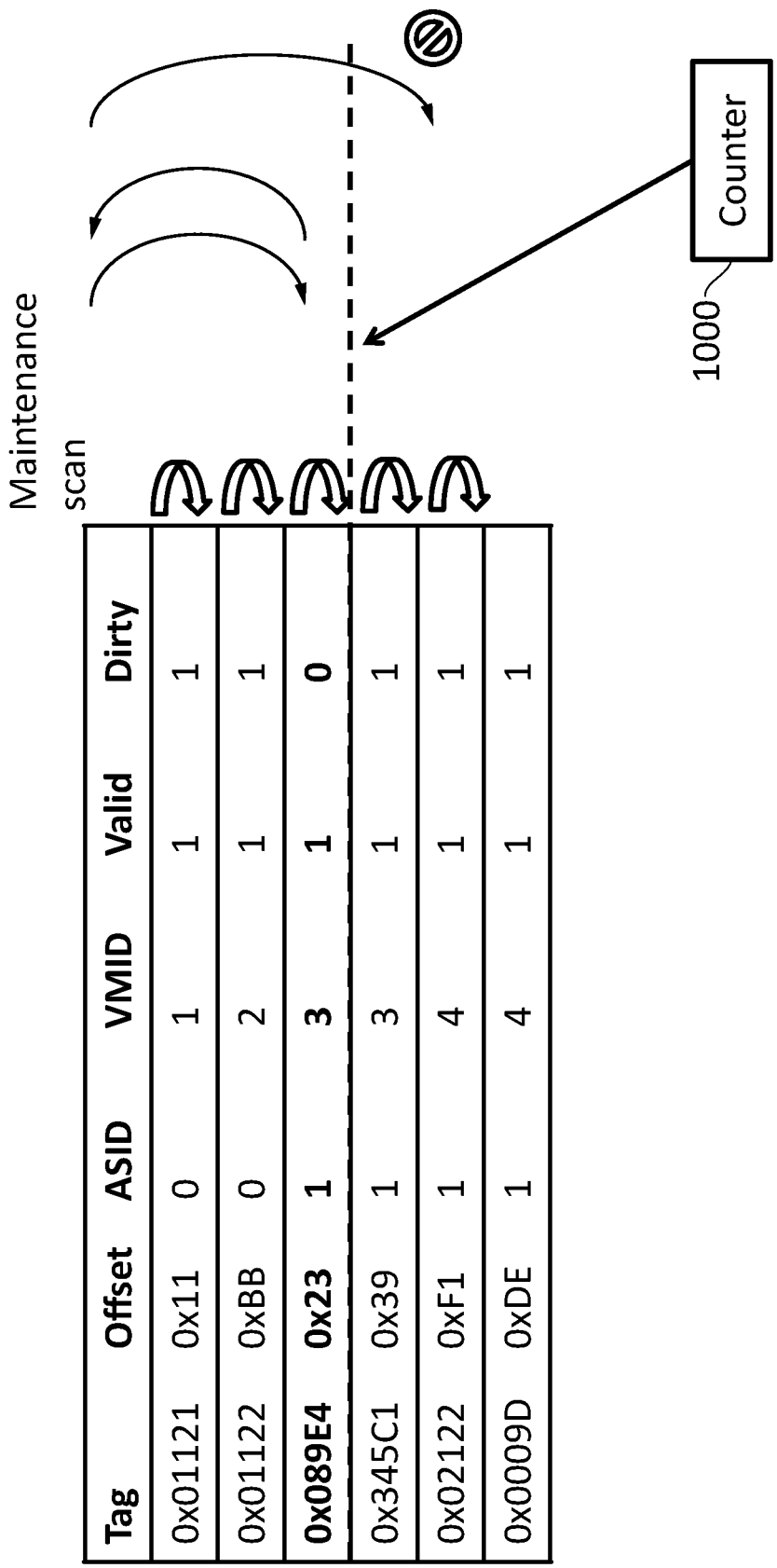
FIG. 11 shows a process of performing an access request during a maintenance operation in accordance with some embodiments.

Improving Asynchronous Maintenance Efficiency by Allowing Requests Mid-Maintenance FIG. 11 provides an example in which the selected maintenance operation comprises scanning through at least some of the lookup circuitry 230 and performing an action in response to a condition being met; and in response to receiving a fill operation relating to an input address, the fill operation is performed when the input address corresponds with a part of the lookup circuitry 230 that has already been scanned in respect of the selected maintenance operation.

Accordingly, while a maintenance operation is being performed it may be possible to simultaneously permit an output address to be provided in response to an input address being input. In particular, the part of the lookup circuitry 230 that has already been subjected to the maintenance operation can be considered to be accessible, while the remaining portion of the lookup circuitry 230 is considered to be inaccessible. In this way, if an input address relates to an entry of the lookup circuitry 230 which has already been scanned in respect of the selected ongoing maintenance operation, then the corresponding output address can be provided. Alternatively, if the input address relates to a part of the lookup circuitry 230 that has not been scanned in respect of the selected maintenance operation, or if the input address does not relate to any of the entries in the lookup circuitry 230, then a miss is provided back to the requester. Accordingly, it is not necessary for the maintenance operation to complete in order for translations to be provided. Hence, instead of providing a miss, the result of the translation may be provided. A counter 1000 is provided in order to track the point in the lookup circuitry 230 for which the maintenance operation has been performed. A comparator can be used in order to determine whether the part of the lookup circuitry 230 that will be affected the lookup operation or fill operation that has already been scanned by the maintenance operation.

FIGS. 2 and 11 therefore also provide an example of an apparatus comprising: storage circuitry 230 to store a plurality of entries, wherein the storage circuitry 230 is adapted to perform a search for a selected entry by scanning at least some of the plurality of entries; reference circuitry 1000 to store an indication to a part of the storage circuitry 230 that is still to be scanned as part of the search; and processing circuitry (implemented in this example by the control circuitry 240) to perform an operation that will affect one of the plurality of entries in response to said one of the plurality of entries being absent from the part of the storage circuitry 230 that is still to be scanned as part of the search as indicated by the reference circuitry. In this case, the part of the storage circuitry 230 that is still to be scanned is pointed to by the counter 1000, which is updated during the search. Note that in some embodiments, only a subset of possible entries is part of the search process, even from the beginning. For instance, where the storage circuitry 230 utilises a hash table, having determined approximately where the entry is located, only a subset of entries are to be searched in order to find the matching entry. In this way, entries can be inserted into storage circuitry even while a search is being performed, for instance.

Stealing Storage

Figure 12:
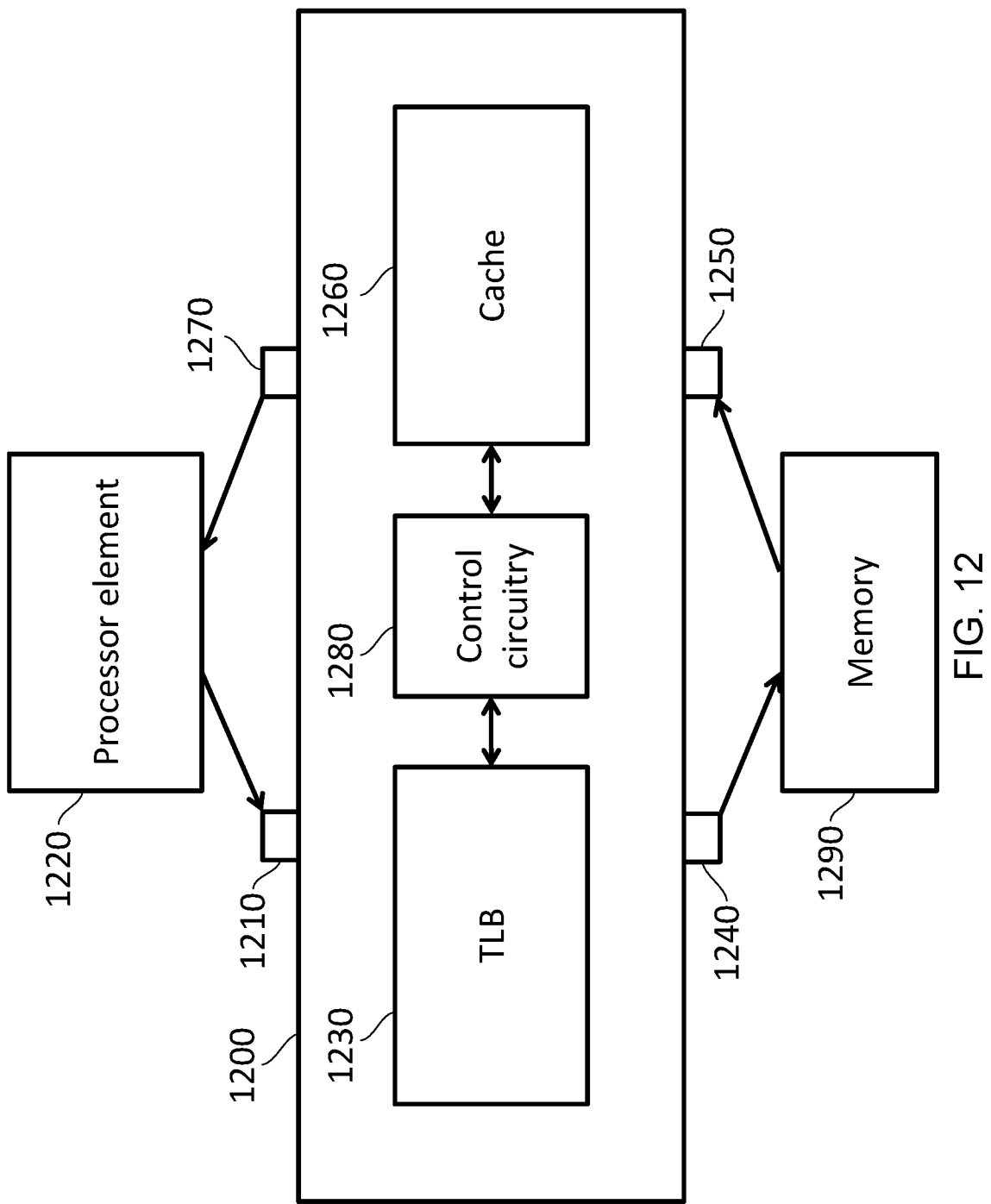
FIG. 12 illustrates an example apparatus in accordance with some embodiments.

FIG. 12 illustrates an apparatus 1200 in accordance with some embodiments in which a processor element 1220 provides input addresses to the input port 1210. The input address is provided to a Translation Lookaside Buffer (TLB) 1230, which stores a translation between the input address and the output address in an output space. An output address port 1240 allows the output address (or a further translation of the output address) to be output in order to access a memory 1290 at that address. At the same time, the processor element 1220 is able to receive data via an input data port 1250. In some embodiments (such as the one shown in FIG. 12), the input data port is from the memory 1290 to the apparatus 1200 so that when the memory 1290 is accessed, the data at that location in memory 1290 is provided back to the apparatus. This data can be stored in a cache 1260, e.g. backed by a DRAM. Finally, there is an output data port 1270 at which the data is output. In some embodiments, such as the one shown in FIG. 12, the data output port is provided to enable the apparatus 1200 to output the data back to the processor element. Control circuitry 1280 is used to control the TLB 1230 and the cache 1260. Furthermore, although the cache 1260 is used to store data, it is also used to store some translations. In this way, the TLB 1230 "steals" storage space from the cache 1260 to store translations, e.g. when the TLB 1230 is otherwise unable to store the translation. Note that there is no obligation for input data port 1250 and the output data port to be arranged in the manner they are. For example, the data could be received from the processor element 1220 and output to the memory 1290. Indeed, data could be received and output in both directions as a consequence of data being both read from and written to memory 1290. Furthermore, the various ports 1210, 1240, 1250, 1270 could be combined—either by combining the inputs ports 1210, 1250 together and the output ports 1240, 1270 together, or by combining the processor ports 1210, 1270 together and the memory ports 1240, 1250 together or even combining all four ports 1210, 1240, 1250, 1270 together.

Consequently, FIG. 12 provides an example of an apparatus 1200 comprising an input address port 1210 to receive an input address from processor circuitry 1220; address storage (implemented in this example by the TLB 1230) to store a translation between the input address and the output address in an output address space; an output address port 1240 to output the output address; an input data port 1250 to receive data; data storage (implemented in this example by the cache 1260) to store the data in one of a plurality of locations; an output data port 1270 to output the data stored in a data storage; and control circuitry 1280 to cause the data storage to store the translation between the input address and the output address, wherein the control circuitry is adapted to issue a signal to cause a page walk to occur in response to the input address being absent from the address storage and the data storage.

In this manner, even though the amount of space available for translations can increase, the size of the TLB 1230 itself remains unchanged. Consequently, the time taken to look up a translation in the TLB 1230 need not significantly change. In particular, if it is known that the translation is stored in the TLB 1230 then little or no additional access time is required. This could be achieved by using, for instance, a predictor, that is used to speculate about where the translation will be found. If the location is unknown then access to the TLB 1230 and cache 1260 could be parallelised so that a translation is simultaneously looked up in both the TLB 1230 and the cache 1260. Again, this can greatly limit any increased lookup time required.

Similarly, the circuit size need not significantly increase as a consequence of this change. In particular, since the size of the TLB 1230 remains unchanged, and since the translation is stored in cache 1260 that might otherwise be expected to exist on such a circuit, the storage that is "stolen" in order to store the translation does not necessitate the addition of extra hardware. Consequently, the overall circuit space of the apparatus 1200 need not increase. Hence, a performance improvement can be achieved without the need for an increase in the circuit space. Note that FIG. 12 also provides an example in which the cache 1260 and the TLB 1230 are separate memories. In particular, the Translation Lookaside Buffer (TLB) 1230 and the data cache 1260 are separate devices on the data circuitry. In some embodiments, each of these devices could have their own individual control circuitry instead of or as well as their own control circuitry 1280. There is however no need for the data storage and the address storage to be separate memories. In particular, in some embodiments, the TLB 1230 and the cache 1260 may be the same memory and thereby pool the same area of memory for multiple purposes.

Figure 13:
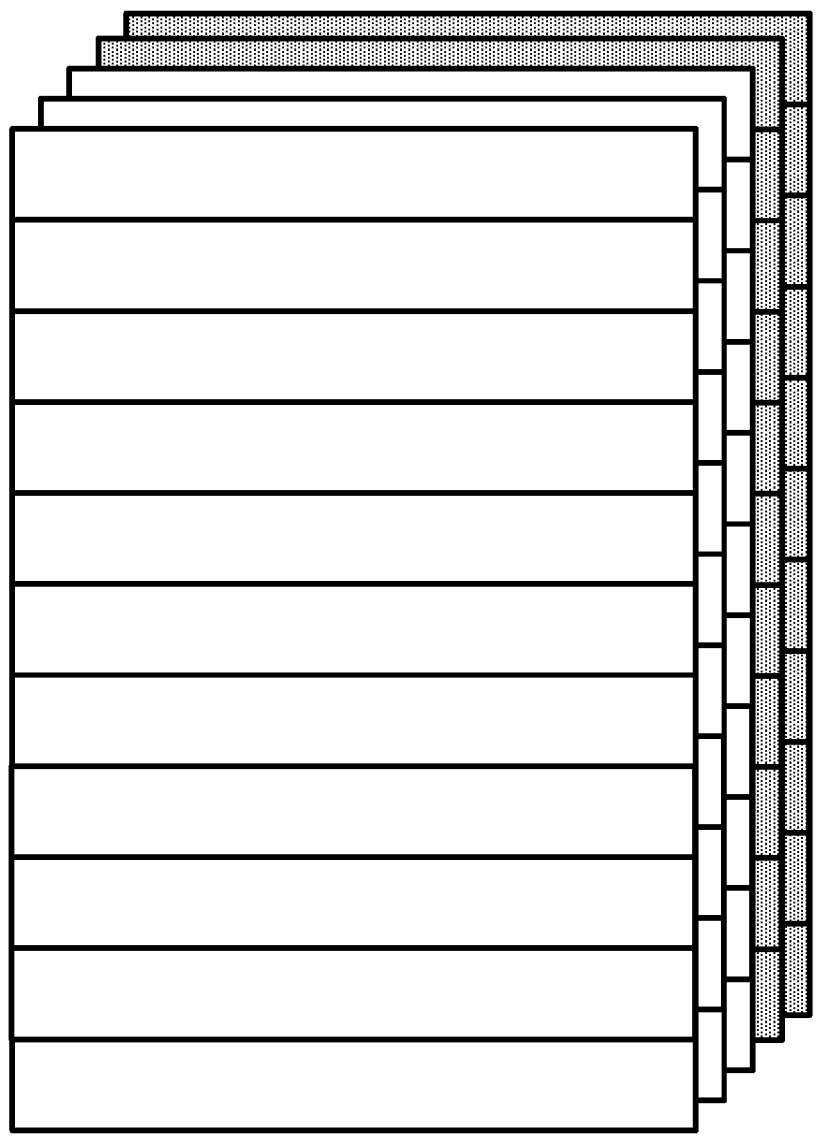
FIG. 13 illustrates the reallocation of ways within a cache in accordance with some embodiments.

FIG. 13 shows an example in which the plurality of locations takes the form of an n-ways set-associative memory; and the control circuitry 1280 is adapted to cause the cache 1260 to store the translation in one or more repurposed ways of the n-ways. In a set-associative memory, there are a number of locations in which a piece of data may be stored. Each such location is referred to as a "way". This may arise, for instance, as a consequence of the amount of storage in the set-associative memory being significantly less than the set of data that is to be stored. By devising the memory in such a manner that there are a number of ways, the flexibility of the memory can be increased. For example, a hash could be performed on the address to work out which location it should be stored in. In case several pieces of data wish to be stored in the same location, a number of 'ways' are provided so that a number of pieces of data can be stored at the same hash value. At one extreme end, memory is 'directly mapped' in which case there is exactly one location in which data can be stored. At the other extent, the memory is fully-associative, in which data can be stored anywhere. In the example of FIG. 13, n is 5, so the memory is 5-way associative. Consequently, for a given piece of data, there are five different locations that that data can be stored. Each way is also comprised of 11 indexes (often referred to as sets) allowing 11 different pieces of data to be stored within each way. In the case of FIG. 13, two of the ways (shaded) have been repurposed such that they can be used by the translation lookaside buffer TLB 1230. Data that would ordinarily be stored in one of these repurposed ways, is instead allocated to one of the other ways.

Figure 14:
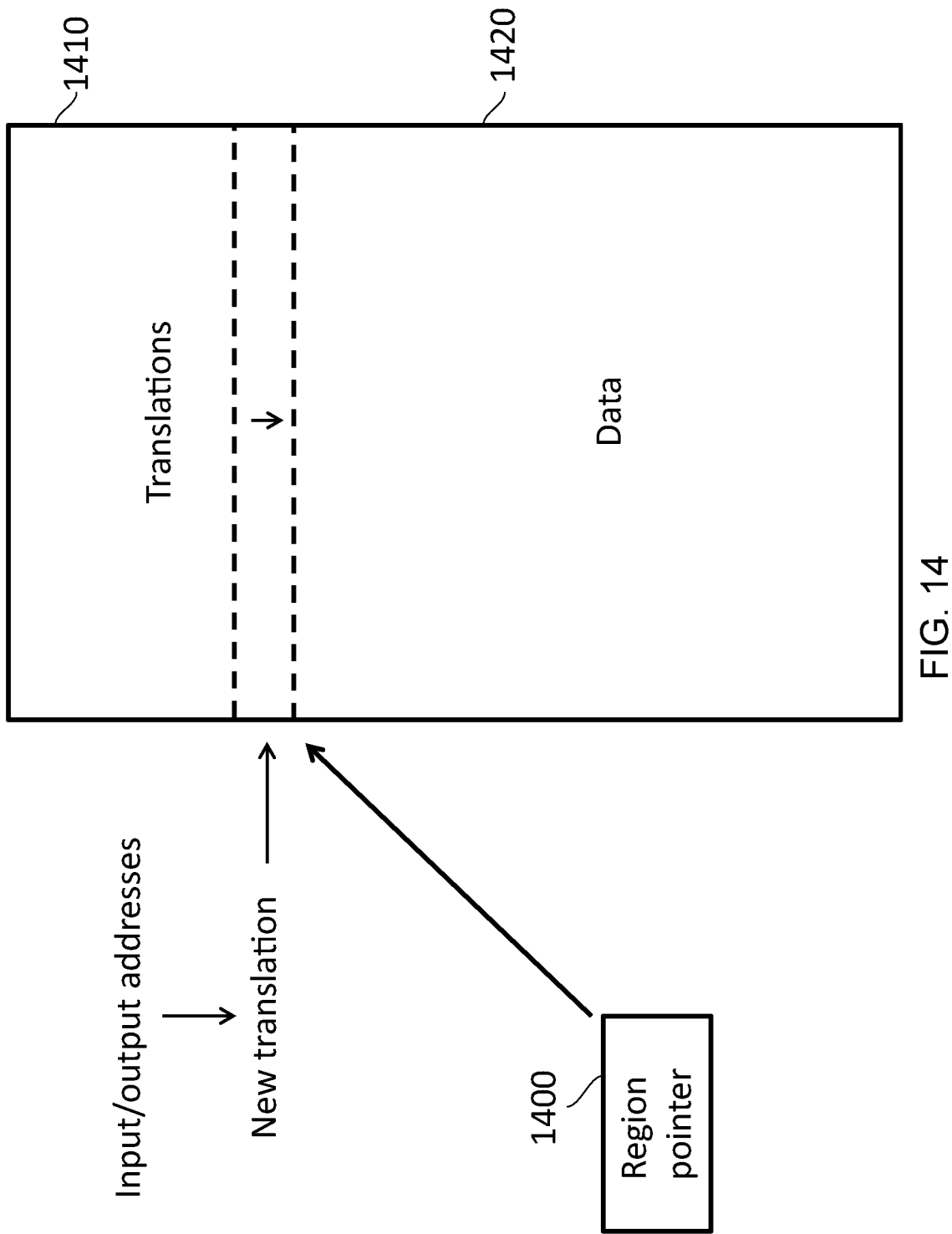
FIG. 14 demonstrates how a single memory can be allocated to multiple purposes using a pointer, in accordance with some embodiments.

Another way of enabling the data storage to be repurposed is by the use of addresses. FIG. 14 illustrates an example in which the plurality of locations takes the form of an n-ways set-associative memory; and the control circuitry 1280 is adapted to cause the cache 1260 to store the translation in one or more repurposed sets 1410 of the memory. In this example, a region pointer 1400 points to an address that marks a boundary between the translations that are stored by the TLB 1230, and the data that is stored by the cache 1260. In this example, the boundary is shown as moving, as sets within the cache 1260 are repurposed for storage of translations. Consequently, when an input (and output) address are provided by the processor circuitry, to create a new translation, the translation can be stored in this repurposed area. It will be appreciated that as the sets are repurposed, a hash function that is used for indexing into the cache 1260 must adapt so that it no longer refers to non-repurposed sets. Meanwhile, the remaining sets 1420 of the cache 1260 can be used for storing data. This boundary may be referenced, for instance, by a set index. In this way, FIG. 14 illustrates an example in which the cache 1260 and the TLB 1230 are different regions within the same memory. FIG. 14 therefore also provides an example of a region pointer 1400 to indicate a border between a region used by the address storage 1410 and a region used by the data storage 1420. For the purposes of the remainder of this description, although the terms 'address storage' and 'data storage' will be used, this is not to be interpreted as requiring separate memories. Furthermore, although examples below may refer to a way, a storage location, or an address, the skilled person would appreciate that the use of repurposing ways or repurposing sets are interchangeable techniques. FIG. 14 therefore illustrates an example of a method comprising: receiving an input address from processor circuitry; storing, in TLB 1230, a translation between the input address and an output address in an output address space; receiving data; storing the data in data storage (such as the cache 1260); causing the cache 1260 to store the translation between the input address and the output address; and in response to the input address being absent from the address storage and the data storage, issuing a signal to cause a page walk to occur.

Stealing Storage Using Policies

Figure 15:
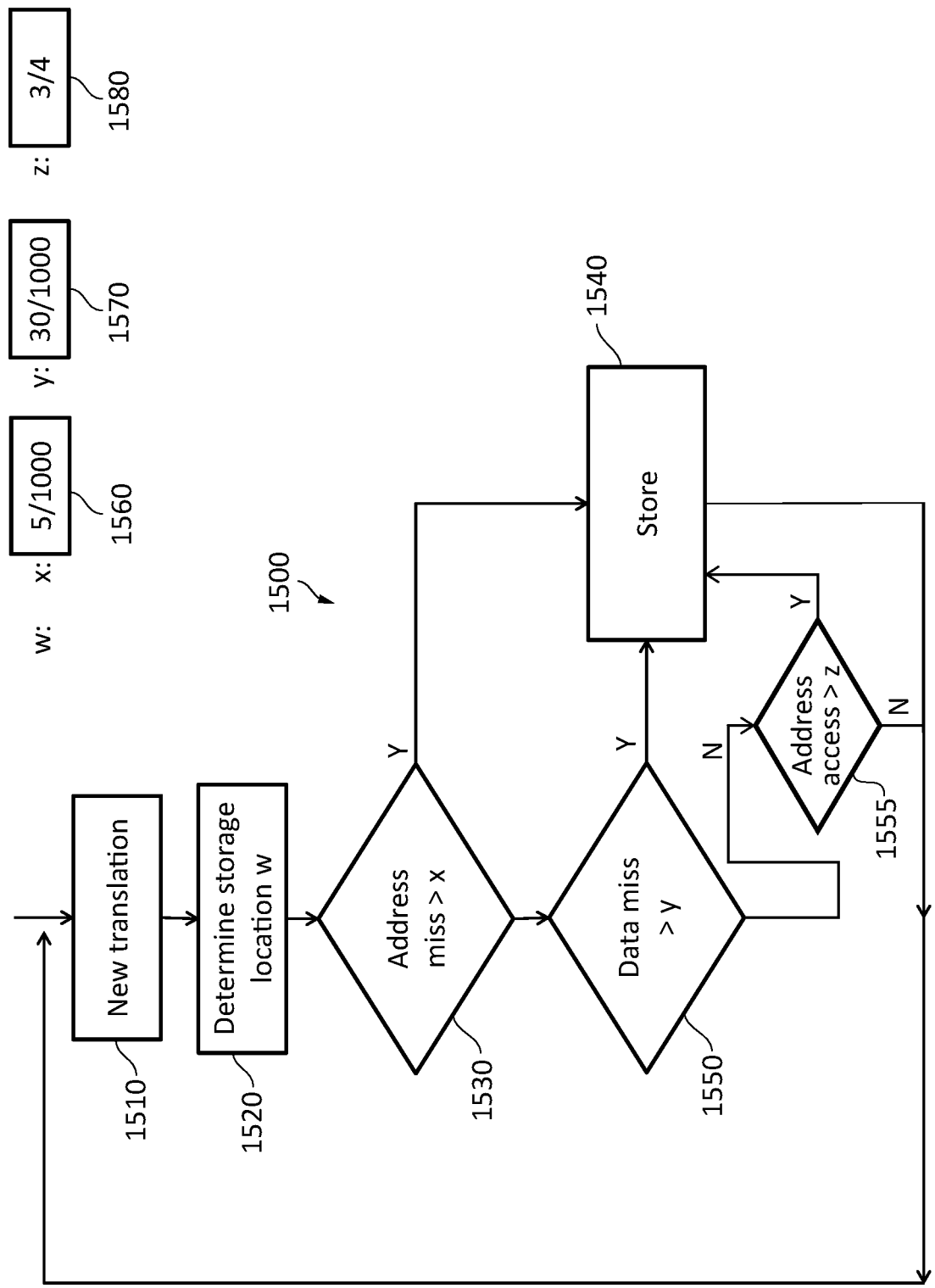
FIG. 15 illustrates an example method of dynamically reallocating data and address translations in accordance with some embodiments.

FIG. 15 shows an example of a policy in accordance with some embodiments. In particular, FIG. 15 shows an example in which a policy indicates for each of the plurality of locations, a preference for storing a translation compared to data. The policy is shown in the form of a flowchart 1500. At a step 1510, a new translation is received. At step 1520 a storage location w is determined based on the translation. This could be calculated based on performing a hash operation, such as performing a modulus operation on the input address or the output address that is the subject of the translation. At a step 1530, it is determined whether the current address miss rate is greater than a value x for the storage location w 1560. In the example of FIG. 15, the value of x for w is 5 out of 1000. Accordingly, if the address miss rate in this case is greater than 5 for every 1000 instructions executed by the processor circuitry 1220, then the process proceeds to step 1540, where the translation is stored (e.g. in the data storage such as the cache 1260). If not, then at step 1550, it is determined whether the data miss rate is greater than a value y for the storage location w 1570. In this case, the value is set at 30 out of 1000. Accordingly, if the data storage miss rate is greater than 30 for every 1000 instructions executed by the processor circuitry 1220, then the process proceeds to step 1540, where the translation is stored in the cache 1260. Alternatively, the process proceeds to step 1555, where it is determined whether the address storage access rate is greater than a value z for the storage location w 1580. In this case, the value is set at 3 out of 4. Accordingly, if the access rate for the address storage is greater than 3 out of 4 instructions executed by the processor circuitry 1220, then the process proceeds to step 1540, where the translation is stored in the cache 1260. Alternatively, the process proceeds back to 1510. In other words, the translation is not stored. In this example, the translation is stored in the data storage as a consequence of any of three conditions being met. The first is that the address miss rate is greater than a first variable x. In this example, the value of x is given as 5 per 1000 instructions executed by the processor circuitry 1220. However in another system, this value could be for example 10 misses per 1000 instructions executed. A high address storage miss rate can indicate an inefficiency occurring in the system. Accordingly, when the address storage miss rate reaches a certain point, it becomes more desirable to store translations in order to increase the efficiency of the system. The second condition that can be met in order for the translation to be stored is that the data miss rate is above a variable y. In this example the variable y for the storage location w is equal to 30 per 1000 instructions executed. However, in another system, this could be equal to 40 misses per 1000 instructions. A large number of misses with respect to the data storage indicates that there is poor data locality in the instructions being executed. Accordingly, the space that is ordinarily used for the storage of data may be better used by instead storing translations. Hence, when the data storage rate reaches a certain point, it may be more desirable to store the translation. The third condition that can be met in order for the translation to be stored is that the address storage access rate is above a variable z. In this example, the variable z for the storage location w is equal to 3 per 4 instructions executed. A large access rate indicates that there could be contention for one of the storage devices, and it could therefore be desirable to spread the workload by storing data in the data storage instead.

FIG. 15 also illustrates an example where the replacement policy is dynamically configurable. In particular, the values of x, y, and z for w are stored in registers 1560, 1270, and 1580, respectively. In this way, the preference for storing translations rather than data for the storage location w can be varied. It will of course be appreciated, that global values for x, y, and z could also be set, which would be valid across all storage locations. FIG. 15 also provides an example of where the control circuitry 1280 is adapted to cause the cache 1260 to store the translation between the input address and the output address in dependence on at least one first condition. In particular, FIG. 15 illustrates an example of where the first condition is from the list comprising: a miss rate of the TLB 1230, a hit rate of the TLB 1230, an access rate of the TLB 1230, a miss rate of the cache 1260, a hit rate of the cache 1260, and an access rate of the cache 1260.

It will be appreciated that in some other embodiments, the conditions at steps 1530, 1550, and 1555 could be inverted by testing for a value less than a predefined constant. In the case of the tests at steps 1530 and 1550, the test could be for a value greater than a predefined constant rather than less than. Furthermore, in the case of the test at step 1555, the access rate could consider the access rate of the data storage. Other metrics could also be considered instead or as well. For instance, another metric that could be used is the number of misses, hits, or accesses in a number of clock cycles.

Figure 16:
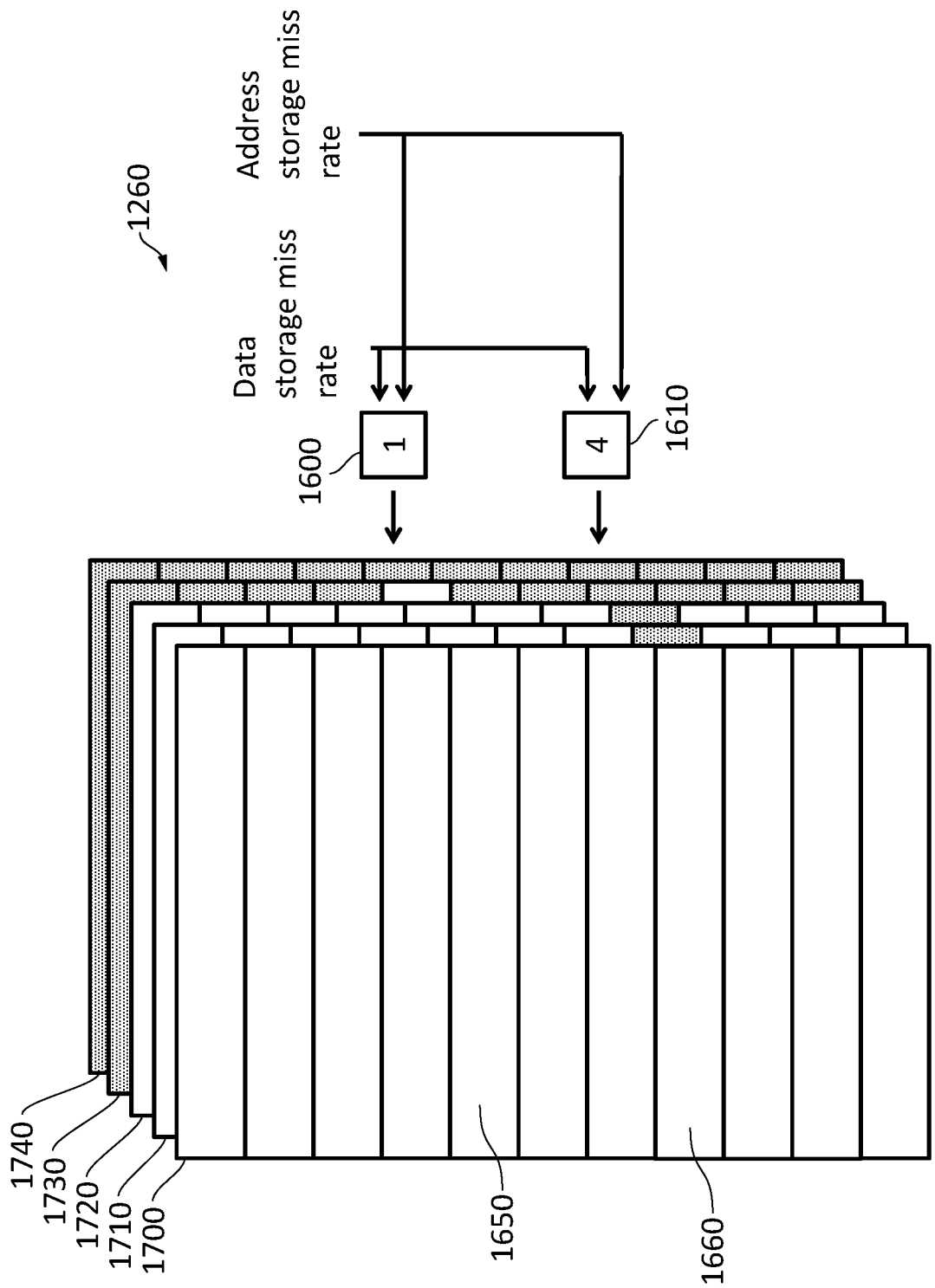
FIG. 16 shows how the use of different allocation policies alters the distribution of cache ways in accordance with some embodiments.

FIG. 16 provides an example in which the control circuitry 1280 is adapted to cause the translation between the input address and the output address to be stored in a part of the cache 1260. In this example, the cache 1260 is a cache. In particular, the cache 1260 is a 5-way associative cache, with each way comprising 11 storage locations. The part of the cache 1260 into which the translation is stored is shown in grey. In particular, it will be noted that the number of ways differs for each storage location. For example, a first storage location 1650 has only a single way allocated for the storage of the translation, as specified by a first indicator 1600, which considers a data storage miss rate and an address storage miss rate at a time when a translation is considered for storage in that location 1650. A second storage location 1660 has four ways allocated to the storage of the translation as specified by a second indicator 1610, which again considers a data storage miss rate and an address storage miss rate when a translation is considered for storage in that location 1660. In this manner, FIG. 16 is an example of where a size of the part is dependent on at least one second condition. In particular, FIG. 16 shows an example where the second condition is from the list comprising: a miss rate of the TLB 1230, a hit rate of the TLB 1230, an access rate of the TLB 1230, a miss rate of the cache 1260, a hit rate of the cache 1260, and an access rate of the cache 1260. It will be appreciated that since the data storage miss rate and the address storage miss rate change over time, different storage locations can end up with different amounts of storage allocated for translations. This provides flexibility so that if a large number of translations occur at a time when the miss rates are high, then storage can be provided for those translations regardless of where in memory they are to be placed.

Stealing Storage Access Processes

Figure 17A:
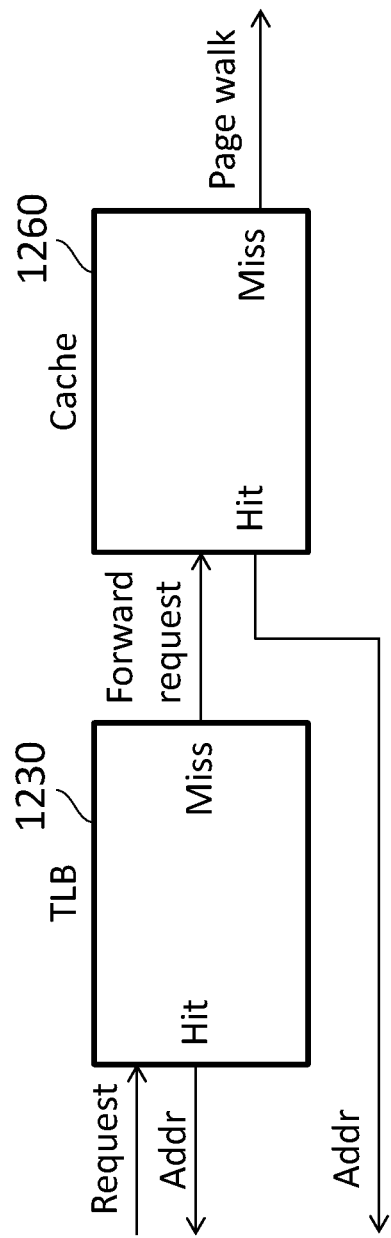
FIG. 17A illustrates how a request for an address at a TLB is forwarded, in accordance with some embodiments.

FIG. 17A illustrates an example of which in response to a miss on the input address in the TLB 1230, a read request is sent to the cache 1260 for the translation. In particular, a request is received at the TLB 1230, from the processing circuitry 1220. The request comprises an input address for which the corresponding output address is desired. If such translation is found at the TLB 1230, then a "hit" occurs, and the output address is forwarded back to the processing circuitry 1220. If not, then a "miss" occurs, and the request is forwarded to the cache 1260, which in some embodiments is a Last Level Cache (LLC). Here, the part of the cache 1260 that is "stolen" for use by the TLB 1230 is searched for the input address. If a "hit" occurs, then the requested output address is forwarded back to the processing circuitry 1220. Otherwise, a "miss" occurs, and due to the cache 1260 being a LLC, this results in a page walk being performed. Note that in examples where the TLB 1230 and the cache 1260 are a single memory, the forwarding may occur locally within the same circuitry. However, in such situations, two searches may still be performed—one on a first storage location used by the TLB 1230 and one on a secondary location primarily used by the cache 1260. Alternatively, a single search may be performed. In each of these examples, if the search or searches have failed, then a page walk is performed by the processing circuitry 1220.

Figure 17B:
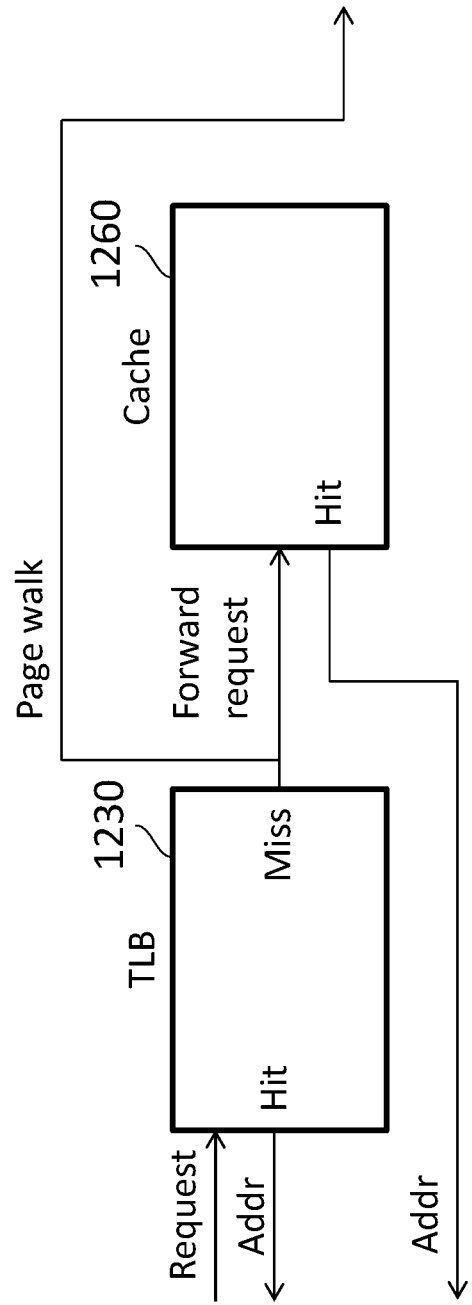
FIG. 17B illustrates issuing a request for an address in parallel, in accordance with some embodiments.

FIG. 17B illustrates an example in which the read request is sent to the cache 1260 in parallel with a page walk request being issued. Accordingly, in response to a miss occurring at the TLB 1230, a request will be forwarded to the cache 1260 and a page walk request will simultaneously be issued by the processing circuitry 1220 to obtain the associated output address. In this manner, if a page walk is necessary, it is not delayed by the additional searching of the cache 1260. This is because the page walk is performed simultaneously with the cache 1260 being searched when the requested output address is found in either the cache 1260 or by performing a page walk it is immediately returned back to the processing circuitry 1220.

Figure 17C:
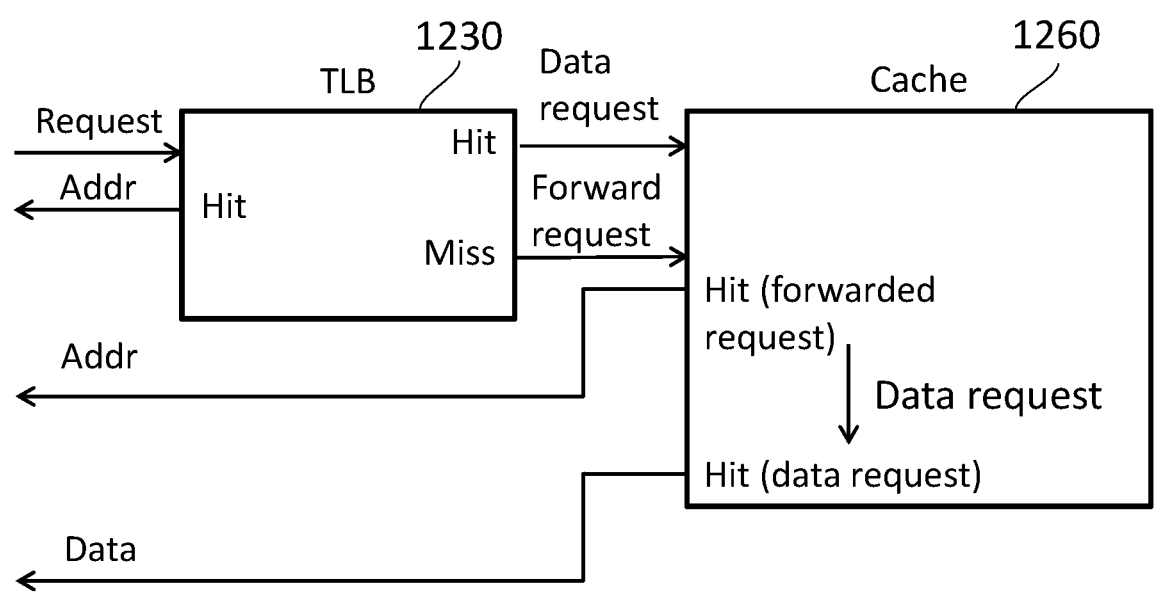
FIG. 17C demonstrates a process in which performing a translation of an address causes the translated address to be provided and the data to be fetched, in accordance with some embodiments.

FIG. 17C illustrates an example in which in response to the output address being determined based on an input address, the apparatus 1200 is adapted to fetch data stored in the cache 1260 that is associated with the output address. When request is received by the TLB 1230, if a hit occurs, then the corresponding output address is forwarded back to the processing circuitry 1220. At that point, a data request is made by the TLB 1230 to the cache 1260. If a hit occurs at the cache 1260 then the data is returned to the processing circuitry 1220. If there is a miss for the requested input address at the TLB 1230, then the request is forwarded to the cache 1260. At that point, if there is a hit, then the output address is forwarded back to the processing circuitry 1220 and a data request is internally made at the cache 1260. Thereafter, if there is a hit for the data request, then the data is forwarded back to the processing circuitry 1220. Accordingly, there is no need for the address to be forwarded back to the processor circuitry 1220 for a subsequent data access request to be made by the processing circuitry 1220. Instead, the data can be returned, together with the address, without necessarily involving the processing circuitry 1220. This saves the time of an address being forwarded, the processing circuitry 1220 issuing a data request, and the data request being forwarded back to the cache 1260. Accordingly, data can be retrieved more quickly. The skilled person will appreciate that misses are handled in the conventional manner.

Figure 18:
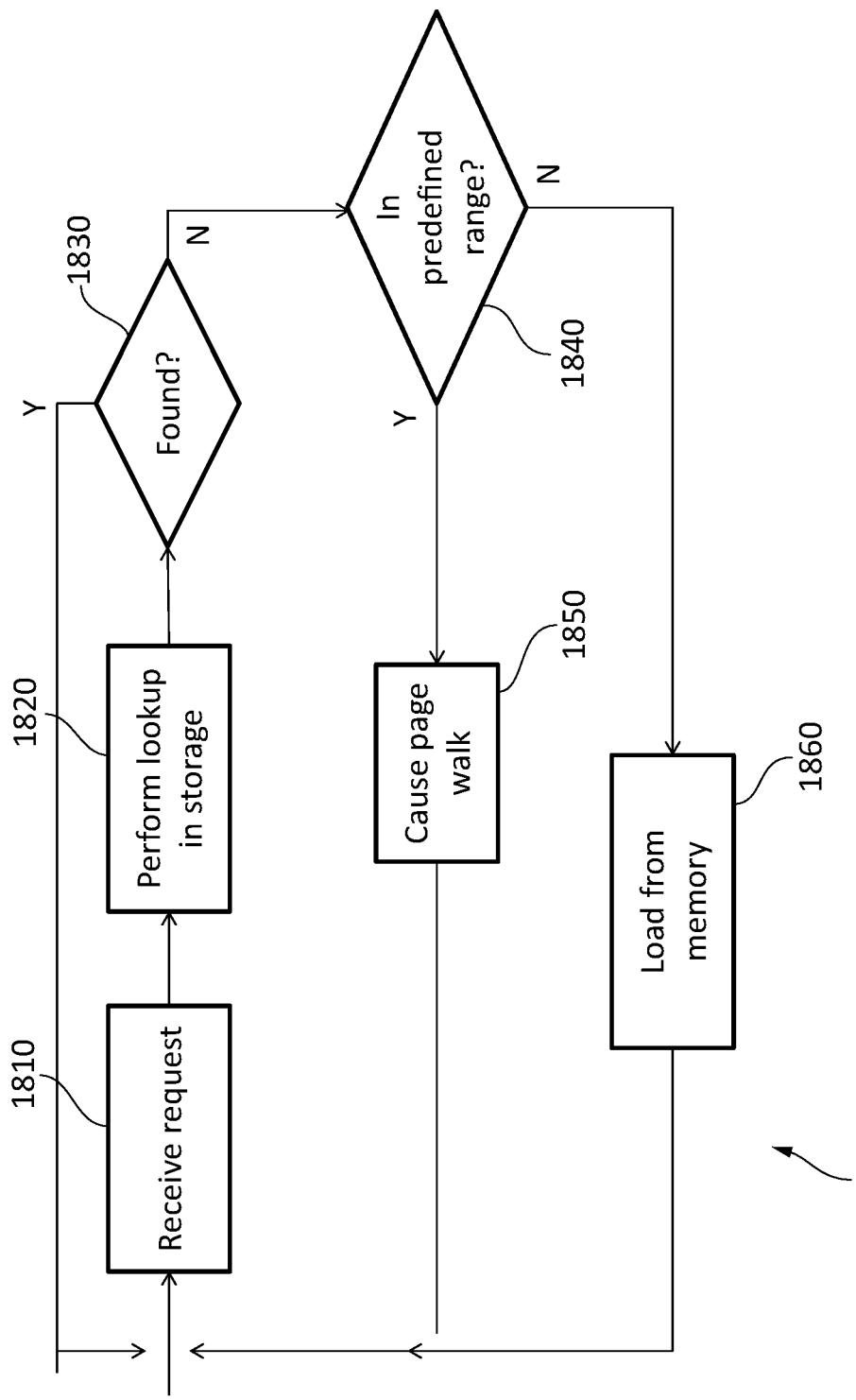
FIG. 18 illustrates a flowchart that shows a method of handling incoming requests in accordance with some embodiments.

FIG. 18 illustrates a flowchart 1800 that shows a method of handling incoming requests in accordance with some embodiments. One way of effecting the stealing of the storage is to create a range of PA space that does not correspond to a backing storage (e.g. via a fake 10 device or a special read request to tell the cache controller to attempt to read an address and return a signal to indicate failure if the read cannot be completed). This mechanism could, for instance, be part of the control circuitry 1280 or part of a controller for the TLB 1230 or cache 1260. This makes it possible to mark a region of cacheable physical address space as being suitable for storing address translations. However, because the range is unbacked, it does not actually store translations in backing storage (e.g. DRAM). In this way, the cache can be made to "cache" translations that are believed to be stored in memory, but are not. If the address provided as part of a request falls within the predefined range, then the request is a request for a translation. While, ordinarily, a request for cacheable data that is not in the LLC would cause the data to be fetched from memory, such an operation cannot be done in the case of the range of PA space that does not correspond to a backing store because, as stated above, this range is not actually backed by memory. Hence, when such a request is detected, it is unable to directly fetch the data from memory. Instead, it issues a signal (e.g. to the control circuitry 1280) that causes a page walk to occur. In some embodiments, this causes the page translations to be loaded from memory, and for the desired address translation to be determined from those page translations.

The flowchart 1800 therefore begins at a step 1810 where a request is received. The request could be for an address translation or it could be for data. The request will therefore contain an address for which either data or a translation is desired. At a step 1820, a lookup is performed. The lookup attempts to fulfil the request in one or more of the TLB 1230 and cache 1260 as previously described. If the desired information is located at step 1830 then the process returns to step 1810 where the next request is received. Alternatively, the process proceeds to step 1840 where it is determined whether the request falls within the predefined range. If so, then at step 1850, a signal is issued that causes a page walk to occur. Alternatively, at step 1860, the data is loaded from memory. In either case, the process then returns to step 1810. In this example, it is assumed that the predefined range is the address space that does not correspond to a backing store. However, in other embodiments, step 1840 could test whether the address falls outside the predefined range and the predefined address range could be defined by the address space that does correspond to a backing store.

The flowchart 1800 therefore illustrates the behaviour of an apparatus in which in response to a request for the translation when the translation is absent from address storage (such as the TLB 1230) and the data storage (such as the cache 1260), the control circuitry 1280 is adapted to issue a signal to cause a page walk to occur.

Timing of TLB Lookup and Page Table Walks

Figure 19:
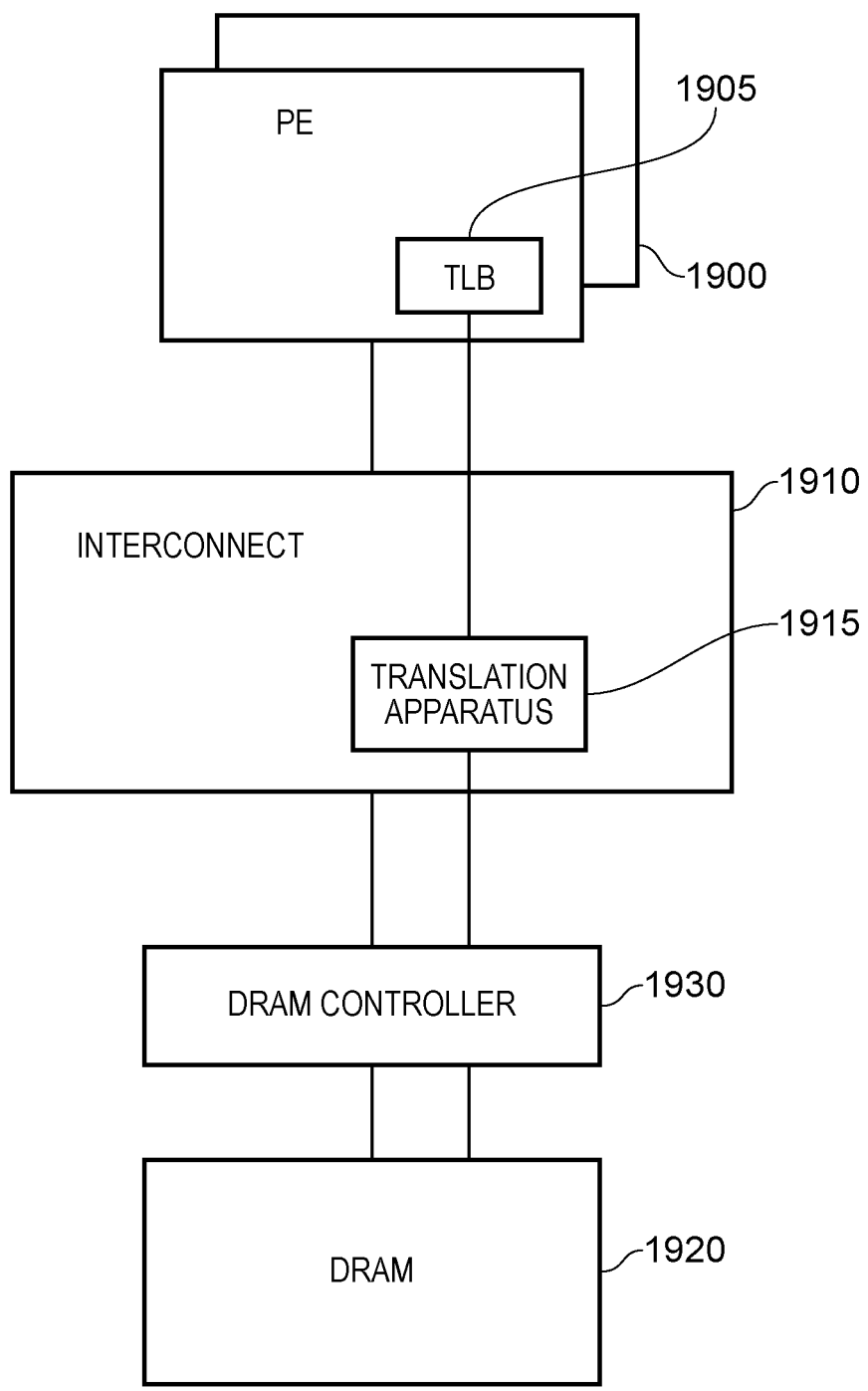
FIG. 19 schematically illustrates a data processing apparatus.

FIG. 19 schematically illustrates another example of a data processing apparatus comprising: one or more processing elements (PE) 1900, an interconnect circuit 1910, a dynamic random access memory (DRAM) 1920 and a DRAM controller 1930. This provides an example of data processing apparatus comprising: a memory 1920 accessible according to physical memory addresses; one or more processing elements 1900 to generate virtual memory addresses for accessing the memory; and memory address translation apparatus 1915 to provide a translation of the initial memory addresses generated by the one or more processing elements to physical memory addresses provided to the memory. In some examples, attributes such as page attributes, read, write and execute permissions can also be obtained as part of the translation process and provided with the output memory address. In example arrangements the one or more processing elements 1900 each comprise a respective translation lookaside buffer 1905 to store a set of translation of the initial memory addresses generated by that processing element to physical memory addresses provided to the memory; the translation lookaside buffer being configured to request a translation not stored by the translation lookaside buffer from the memory address translation apparatus.

The arrangement of FIG. 19 is applicable to the various techniques discussed with reference to FIGS. 20 to 31, either individually or in combination.

Each of the processing elements 1900 can access memory locations in the DRAM 1920. In principle this access could be directly via actual (physical) memory addresses. However, in order to provide partitioning and a degree of security between memory accesses by different processing elements (or in some cases different operating systems running on the processing elements 1900), the processing elements 1900 refer to memory addresses by so-called virtual or initial memory addresses. These require translation into output or physical memory addresses to access real (physical) memory locations in the DRAM 1920.

A first level of translation can be performed by a so-called translation lookaside buffer (TLB) 1905 associated with each processing element. The TLB 1905 stores or buffers recently-used translations between virtual memory addresses and physical memory addresses, so that a virtual memory address supplied to the TLB 1905 is translated to a physical memory address which then forms part of a memory access to be DRAM 1920. However, the TLB has limited size and cannot store every single possible memory address translation which may be called upon by the processing element 1900. In the case that a required translation is not present in the TLB 1905, the TLB refers to translation apparatus 1915, for example forming part of the interconnect circuitry 1910. The translation apparatus will be described in detail below and operates to provide or otherwise obtain the required translation and pass it back to the TLB 1905 where it can be used to translate a virtual memory address into a physical memory address.

Therefore, FIG. 19 provides an example of data processing apparatus comprising:

a memory 1920 accessible according to physical memory addresses;

one or more processing elements 1900 to generate virtual memory addresses for accessing the memory; and memory address translation apparatus 1915 to translate the virtual memory addresses generated by the one or more processing elements to physical memory addresses provided to the memory.

Figure 20:
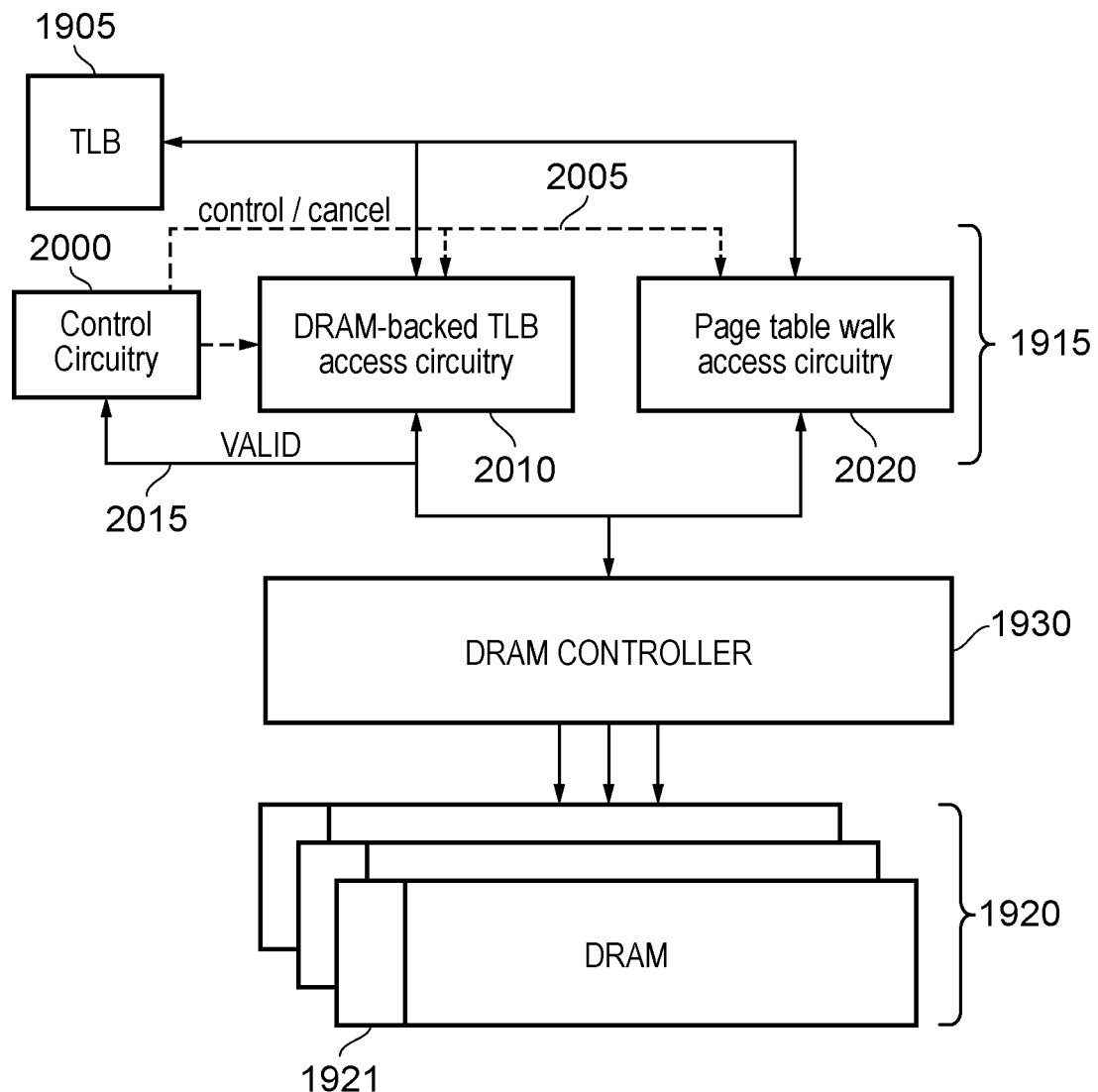
FIG. 20 schematically illustrates address translation circuitry and the storage of translation data in a DRAM.

FIG. 20 shows the operation of the translation apparatus in more detail.

The translation apparatus 1915 maintains a so-called DRAM-backed TLB. That is to say, the translation apparatus 1915 maintains a buffer similar to the TLB 1905 but generally rather larger, containing translation data, in the DRAM 1920 (shown schematically as a reserved or shaded portion 1921 of the DRAM 1920). Maintaining such a buffer in the DRAM 1920 allows the buffer to be relatively large because the DRAM capacity, often off-chip relative to the processing elements 1900, is typically much larger than the typical on-chip static ram (SRAM) storage provided for the TLB 1905.

So, a first attempt to obtain a required translation requested by the TLB 1905 is for the translation apparatus 1915 to consult the DRAM-backed TLB data.

However, the DRAM-backed TLB also has a limited size, albeit rather larger than that of the TLB 1905. In the case that data is not found for a particular translation in the DRAM-backed TLB, a so-called page table walk process can be carried out. This involves consulting a hierarchy of so-called page tables also stored in DRAM which, together, provide a definitive set of all currently allowable memory address translations.

The translation apparatus 1915 comprises control circuitry 2000 to control a DRAM-backed access circuitry 2010 and a page table walk access circuitry 2020. Both of these consult respective portions of the DRAM 1920 via the DRAM controller 1930 to obtain either an instance of translation data in the case of the DRAM-backed TLB access circuitry 2010 or page table data from which the translation can be derived, in the case of the page table walker access circuitry 2020. The control circuitry 2000 is therefore responsive to an input initial memory address to be translated, to request retrieval of translation data for the input initial memory address from the translation data buffer and, before completion of processing of the request for retrieval from the translation data buffer, to initiate retrieval of translation data for the input initial memory address by the page table access circuitry.

The page table walk access circuitry 2020 is arranged to access page table data to retrieve translation data defining an address translation between an initial memory address in an initial memory address space, and a corresponding output memory address in an output address space. The DRAM-backed TLB is an example of a translation data buffer to store, for a subset of the virtual address space, one or more instances of the translation data.

As part of its operation, the DRAM-backed TLB access circuitry 2010 provides a "valid" signal 2015 to the control circuitry 2000. The control circuitry 2000 provides control and, in some instances, cancellation (or at least cancellation initiation) signals 2005 to the DRAM-backed TLB access circuitry and the page table walk access circuitry 2020. This provides an example in which the translation data buffer is configured to respond to a request for retrieval of given translation data by providing a response comprising either the given translation data or data indicating that the given translation data is not currently held by the translation data buffer.

Examples of the use of these signals will be discussed below.

Example arrangements provide variations of the timing of operation of the circuitries 2010, 2020 relative to previously proposed arrangements. To place these into context, FIG. 21 is a schematic timing diagram illustrating the operation of a previously proposed TLB and translation apparatus.

Figure 21:
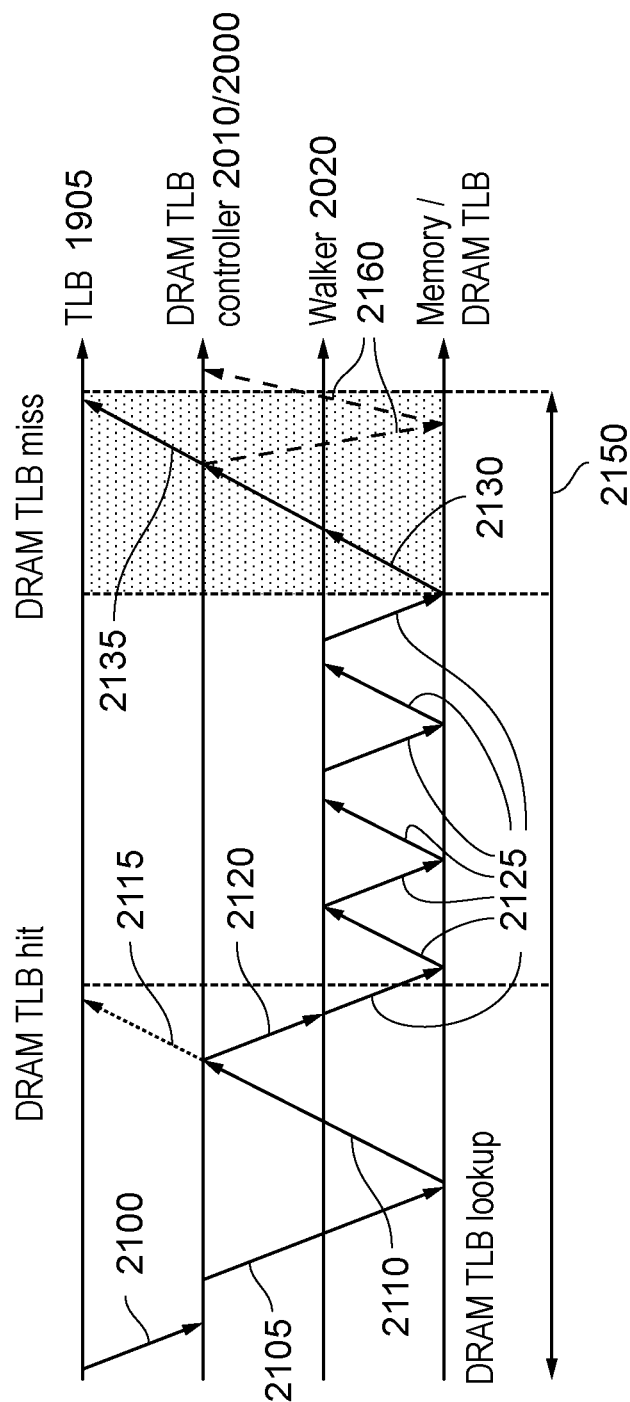
FIGS. 21 and 22 are schematic timing diagrams.

Four horizontal lines in FIG. 21 schematically illustrate operations by the TLB 1905, the DRAM-backed TLB access circuitry 2010, the page table walk access circuitry 2020 and the DRAM 1920 respectively. Time runs from left to right as drawn.

An access to the DRAM-backed TLB is prompted by a required translation not being found in the TLB 1905 such that the TLB 1905 requests (at a stage 2100) the translation from the translation apparatus 1915. In the previously proposed arrangement, this causes the DRAM-backed TLB access circuitry 2010 to access (at a stage 2105) the DRAM to look up whether the required translation data is present. The response from the DRAM 1920 is shown as a stage 2110. If there is a "hit", which is to say the required instance of translation data is found in the DRAM-backed TLB, then that translation data is returned to the TLB as a stage 2115 and the process terminates. If not, the DRAM-backed TLB access circuitry indicates to the control circuitry 2000 that the requested instance of translation data is not available (by not setting the "valid" signal, or by setting it to a state indicating "not valid") such that the control circuitry 2000 then issues a request 2120 to the page table walk access circuitry 2020 to undertake a page table walk to obtain the required translation. Using established techniques, a page table walk involves multiple successive memory accesses 2125 in order to access the required hierarchy of page tables to obtain a translation. The result is the required translation provided at a stage 2130, being ultimately transmitted at a stage 2135 to the TLB 1905 and the process terminates.

As shown by a stage 2160, but not forming part of the time-critical path of FIG. 21, when the translation data for the input initial memory address is not currently held by the translation data buffer, the control circuitry is configured to store the translation data for the input initial memory address, received from the page table access circuitry, in the translation data buffer in DRAM.

Because in the previously proposed example, the page table walk is not initiated until the DRAM-backed TLB lookup has failed or missed, in the worst case there can be a long delay 2150 between the initial request at 2100 by the TLB 1905 and the TLB 1905 receiving the requested translation data.

Figure 22:
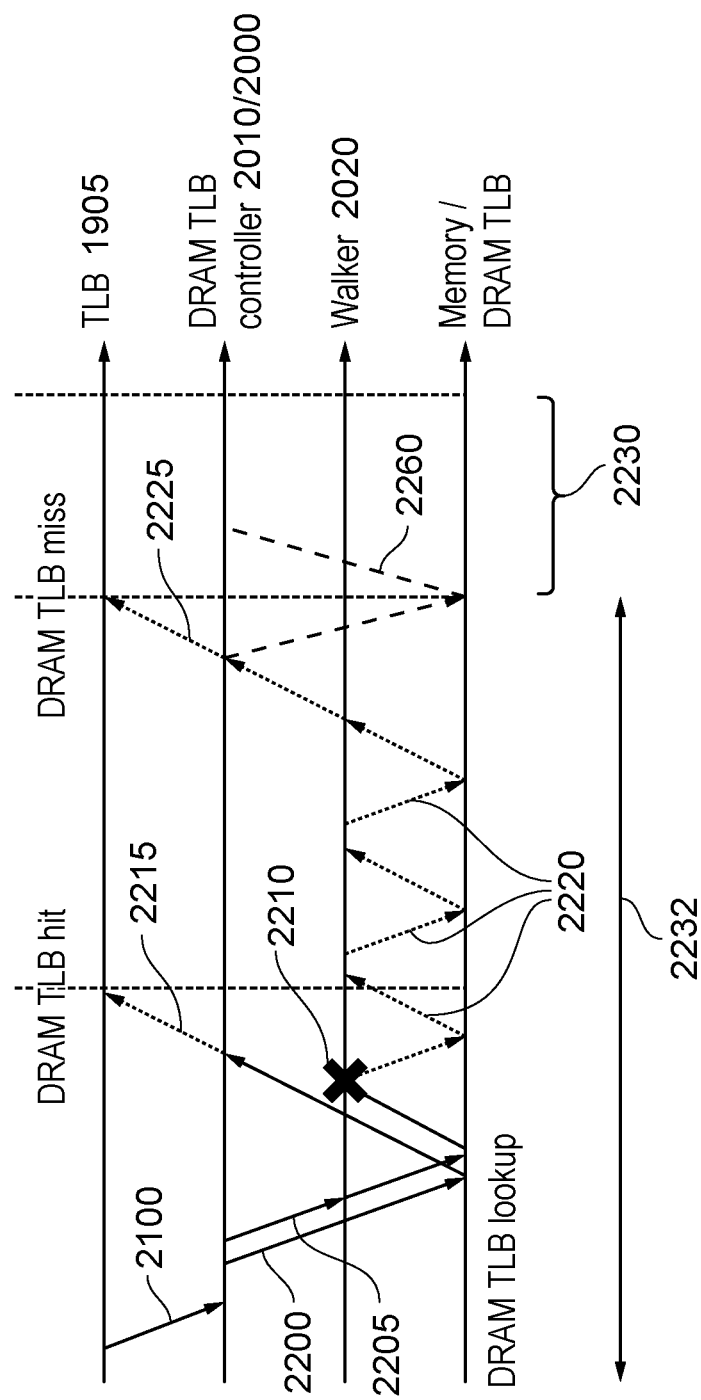

In contrast, FIG. 22 schematically illustrates an example arrangement according to examples of the present disclosure, in which the control circuitry is configured to request retrieval of a required instance of translation data from the DRAM-backed TLB and, before completion of the processing of that request for retrieval from the DRAM-backed TLB, to initiate retrieval of the same translation data by the page table walk access circuitry 2020.

In some examples, the control circuitry can initiate both processes substantially at the same time.

So, referring to FIG. 22, after the request 2100 by the TLB 1905, the control circuitry 2000 initiates a DRAM-backed TLB lookup 2200 and, substantially at the same time, or at least before completion of that TLB lookup, a page table walk 2205 by the page table walk access circuitry 2020. Both processes therefore proceed concurrently. This can save latency in situations where a page table access is required, by starting the page table access "early" rather than waiting until the translation data buffer access has failed.

Optional Early Termination of Page Table Access

If, however, there is a hit by the DRAM-backed TLB access circuitry 2010, then optionally the page table walk can be terminated (illustrated schematically at a stage 2210). This is not a requirement and the page table walk could in fact be allowed to complete, in which case all that would happen is that the same translation data would be retrieved from the page table as well. However, by terminating the page table walk at 2210 in the case of a TLB hit, a power saving (relating to the rest of the page table walk no longer taking place) can potentially be achieved.

In the case of a DRAM-backed TLB hit, the subsequent process is similar to FIG. 21 and the required instance of translation data is provided to the TLB at 2215.

If, however, there is a miss in the DRAM-backed TLB, then the page table walk continues at 2220 through to the provision at a stage 2225 of the required translation derived from the page table walk to the TLB 1905. In this case, the overall latency or time period to provide the translation is shown as 2232 and there is a time saving shown schematically as a period 2230 over the arrangement shown in FIG. 21 by virtue of starting the page table walk early, for example at the same time as the DRAM-backed TLB lookup was started, or at least before completion of the DRAM-backed TLB lookup.

Again, as shown by a stage 2260, but not forming part of the time-critical path of FIG. 22, when the translation data for the input initial memory address is not currently held by the translation data buffer, the control circuitry is configured to store the translation data for the input initial memory address, received from the page table access circuitry, in the translation data buffer in DRAM.

Figure 23:
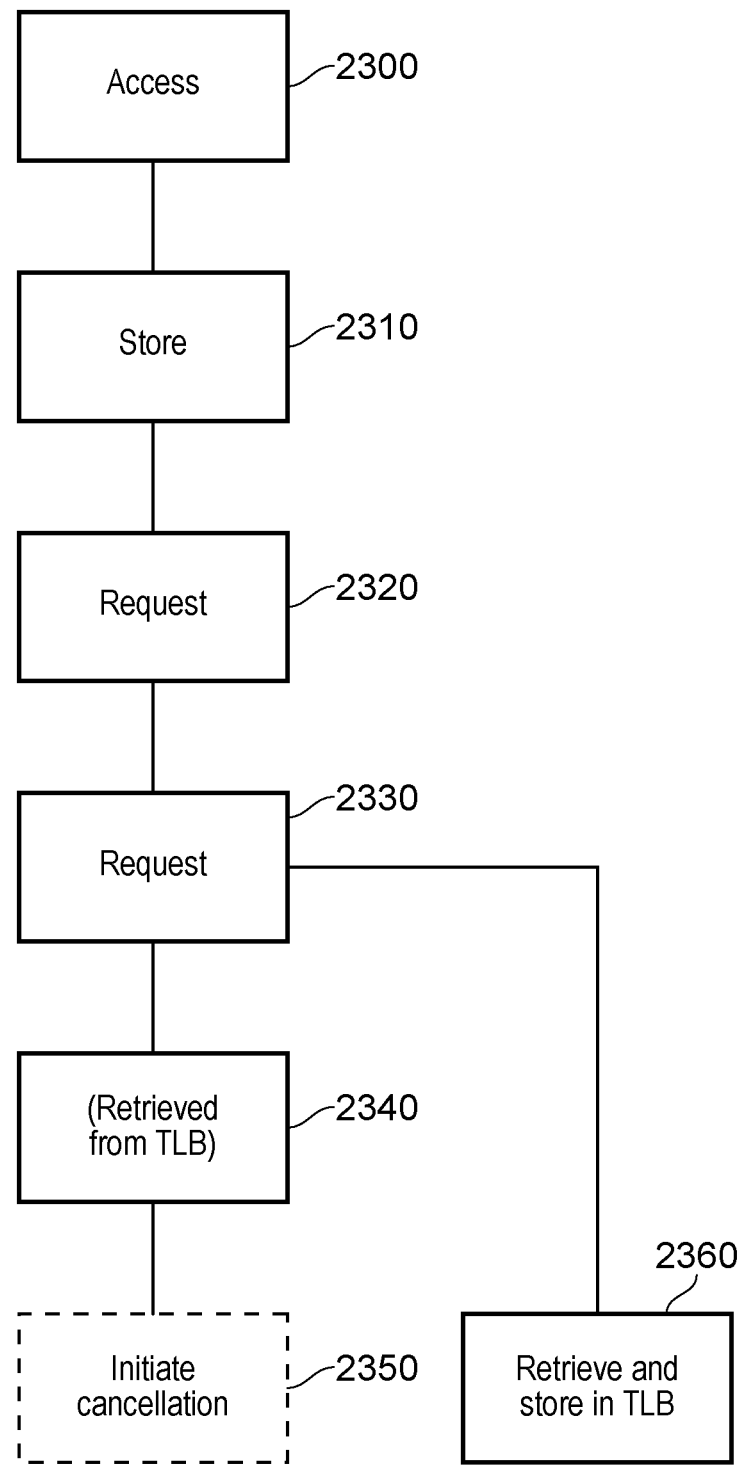
FIG. 23 is a schematic flowchart illustrating a method.

FIG. 23 is a schematic flowchart illustrating a method appropriate to the discussions above.

At a step 2300, page table data is accessed to retrieve translation data defining an address translation between an initial memory address in an initial memory address space and a corresponding output memory address in an output address space.

Here, note that the initial memory address space could be a virtual memory address space and the output memory address space could be a physical memory address space. However, in some other arrangements, a so-called intermediate physical address is used, in some cases so as to hide the translation process or at least the full extent of the translation process, from individual operating systems so that an IPA to PA translation is carried out by a so-called hypervisor. The same principles as those discussed here can relate to any of the following: VA to PA translation; VA to IPA translation; and/or IPA to PA translation.

Therefore, various embodiments are envisaged, all or any of which can be implemented using these techniques, in which:

the initial memory address space is a virtual memory address space and the output memory address space is a physical memory address space; or the initial memory address space is an intermediate physical memory address space and the output memory address space is a physical memory address space; or the initial memory address space is a virtual memory address space and the output memory address space is an intermediate physical memory address space.

In a multi-stage translation arrangement, these techniques could be used for one or more of the translation stages.

Referring back to FIG. 23, at a step 2310, for a subset of the initial memory address space, one or more instances of the translation data are stored in a translation data buffer such as the DRAM-backed TLB.

At a step 2320, in response to an input initial memory address to be translated, such as one received from the TLB 1905, the translation data is requested for retrieval from the translation data buffer such as the DRAM-backed TLB.

Then, at a step 2330, before completion of processing of the request for retrieval from the translation data buffer, retrieval is initiated of the translation data for the input (required) initial memory address by page table access circuitry such as the circuitry 2020 discussed above.

If, in fact, at a step 2340 the required data is successfully retrieved from the DRAM-backed TLB, then a step 2350, which is optional as discussed above, can involve initiating cancellation of the retrieval of translation data for the input initial memory address from the page table in response to the retrieval of the translation data for the input initial memory address from the translation data buffer such as the DRAM-backed TLB. This can in some instances save power by avoiding at least a part of the page table access.

Otherwise, in instances where the data is not successfully retrieved from the DRAM-backed TLB, the required translation data is obtained by the page table walk mechanism at a step 2360 and may be stored in the DRAM-backed TLB.

The steps 2320, 2330 are shown serially in FIG. 23, but in some examples (to provide a potentially improved overall latency saving where a page table access turns out to be needed) the control circuitry can be configured to initiate retrieval of translation data for the input initial memory address by the page table access circuitry substantially simultaneously with requesting retrieval of translation data for the input initial memory address from the translation data buffer. In other words the steps 2320, 2330 can occur at substantially the same time. In principle the step 2330 could even be initiated as the first of the two steps. However, the broadest aspect of the example embodiments just envisages starting the page table access before completion of the translation data buffer lookup, which can still achieve a saving in latency.

Derivation of Predictions

Figure 24:
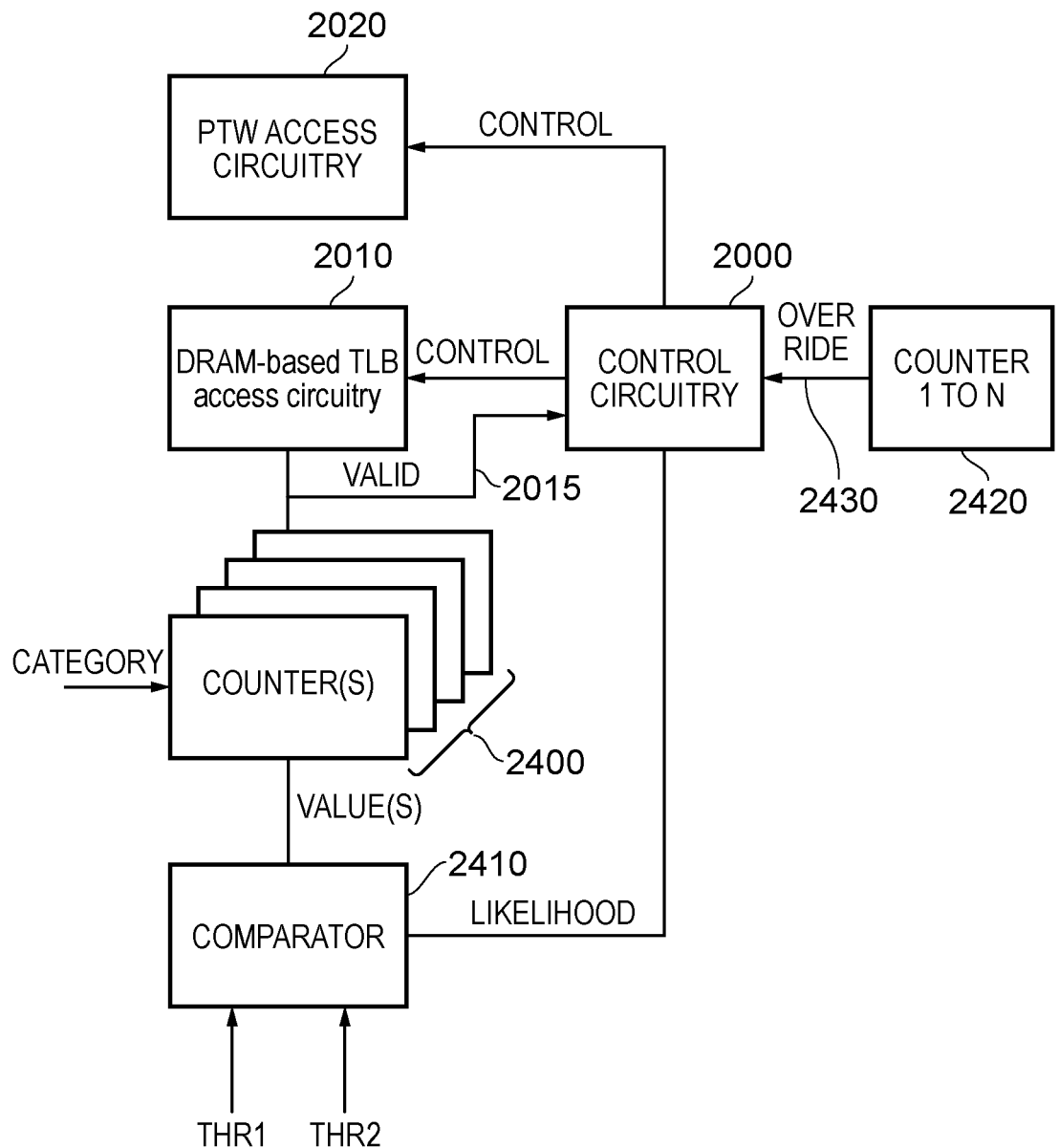
FIG. 24 schematically illustrates address translation circuitry.

Turning now to FIG. 24, in some examples, the control circuitry 2000 is configured to derive a prediction of whether the input initial memory address is currently held by the translation data buffer. Ways in which this prediction can be derived and made use of will be discussed below.

In general terms, if a prediction is provided of whether the required translation is likely to be held by the DRAM-backed TLB, then it can be possible to delay or avoid the page table lookup. In other examples, if a prediction is provided that a page table access is likely to be required, it can be possible to avoid or delay the DRAM-backed TLB lookup. Either of these instances can save power. If the prediction is wrong, however, they can introduce a latency penalty by returning the overall latency of the system to a latency similar to that of FIG. 21. In other words, when the prediction indicates at least a first threshold likelihood that the input initial memory address is currently held by the translation data buffer, the control circuitry is configured to defer initiating retrieval of translation data for the input initial memory address by the page table access circuitry until a response is received from the translation data buffer. In other examples, when the prediction indicates less than a second threshold likelihood that the input initial memory address is currently held by the translation data buffer, the control circuitry is configured to request retrieval of translation data for the input initial memory address from the translation data buffer for no more than a subset of instances of input initial memory addresses to be translated.

As mentioned earlier, the control circuitry 2000 controls the DRAM-backed TLB access circuitry 2010 and the page table walk access circuitry 2020 to access data held by the DRAM 1920. The DRAM-backed TLB access circuitry 2010 provides an availability signal 2015 to the control circuitry 2000 to show whether the DRAM-backed TLB lookup was successful or not. In example arrangements, that availability signal is also provided (in FIG. 24) to one or more counters forming a counter circuitry 2400. The counter circuitry 2400 is arranged to detect, amongst responses by the translation data buffer, relative numbers of instances of a response for which the availability signal indicated that the response comprised the requested translation data and instances of a response comprising data (such as a negative availability indication 2015) indicating that the requested translation data is not currently held by the translation data buffer.

Therefore the control circuitry may comprise counter circuitry to detect, amongst responses by the translation data buffer, relative numbers of instances of a response comprising the requested translation data and instances of a response comprising data indicating that the requested translation data is not currently held by the translation data buffer.

In some examples, the counter circuitry 2400 comprises circuitry to change a count value in one polarity (such as an increment) in response to the translation data buffer providing the requested translation data (a positive availability signal 2015) and to change the count value in the other polarity (such as a decrement) in response to the translation data buffer not holding the data, which is to say the DRAM-backed TLB access circuitry 2010 providing data such as a negative availability indication 2015 that the requested translation data is not currently held by the translation data buffer. Either one of opposite polarities may be used in each case, and the increment amount and decrement amount could be different to one another and need not be +/−1. In other words, the magnitude of an increment does not have to be the same as the magnitude of a decrement.

A comparator 2410 compares the count values with first and second thresholds THR1 and THR2. In some examples, the counter can be a saturating counter so that the count value is constrained not to go beyond an upper count limit or below a lower count limit such as 0.

The counter circuitry 2400 can comprise one counter, or in other examples multiple counters to detect the relative numbers for one or more categories of memory address transaction, so that the prediction may be better matched to the categorisation of the current transaction. A list of example categories can comprise one or more selected from the list consisting of:

- a category indicating a virtual machine requesting the translation (as indicated, for example, by a virtual machine identifier forming part of the translation request);
- a category indicating an initial address space amongst plural initial address spaces (as indicated, for example, by an address space identifier forming part of the translation request);
- a category indicating a program counter of a processor requesting the translation (as indicated, for example, by a program counter value forming part of the translation request); and
- a category indicating the initial address for which the translation is requested.

One of the thresholds THR 1, THR 2 may be a value indicating a first threshold likelihood such as an upper threshold. When the prediction or count value indicates at least the first threshold likelihood, this in turn indicates a likelihood that the input initial memory address is currently held by the translation data buffer, the control circuitry 2000 is configured to defer initiating retrieval of translation data for that input initial memory address by the page table walk access circuitry 2020 until a response is received from the translation data buffer. So, using this threshold, the operation can return to that shown schematically in FIG. 21. In instances where the prediction is correct, this saves power over the operations of FIG. 22. In instances where the prediction is wrong, the latency need be no worse than that of FIG. 21. The prediction is based upon at least an upper threshold occurring for a counted number of recent translation requests (either generally or globally, or for a particular value of the category or categories covered by the multiple counters) having been met by the DRAM-backed TLB.

A second threshold likelihood, representing a lower likelihood that the input initial memory address is currently held by the translation data buffer, is represented by a lower count value and—where the count, or the relevant count, is less than the second threshold—this gives rise to the control circuitry requesting retrieval of the translation data for the input initial memory address from the translation data buffer for no more than a subset of instances of input initial memory addresses to be translated. In some examples, this can be no instances at all, but this could lead to difficulties in detecting an increased count or increased likelihood of the data being held by the DRAM-backed TLB, given that the likelihood is determined by a count of successful TLB lookups. In other words, if the DRAM-backed TLB is no longer used when the count drops below the lower threshold, this could give rise to a situation in which the likelihood of the DRAM-backed TLB holding the required translation can never increase again. To address that potential problem, optionally a further counter 2420, counting up instances of translation data access repeatedly from 1 to N on a modulo N basis, where N is an integer greater than 1, can override by a signal 2430 the likelihood information coming from the comparator 2410 (for example, whenever it reaches N) to force a DRAM-backed TLB lookup by the lookup circuitry 2010 (for example, resetting the prediction mechanism as part of the same operation). In other words, the subset can be 1 in N instances of input initial memory addresses to be translated, where N is an integer greater than one.

Therefore, the use of the second threshold as discussed above provides an example of an arrangement in which, when the prediction indicates less than the second threshold likelihood that the input initial memory address is currently held by the translation data buffer, the control circuitry is configured not to request retrieval of translation data for the input initial memory address from the translation data buffer.

Storage in the DRAM

Figure 25:
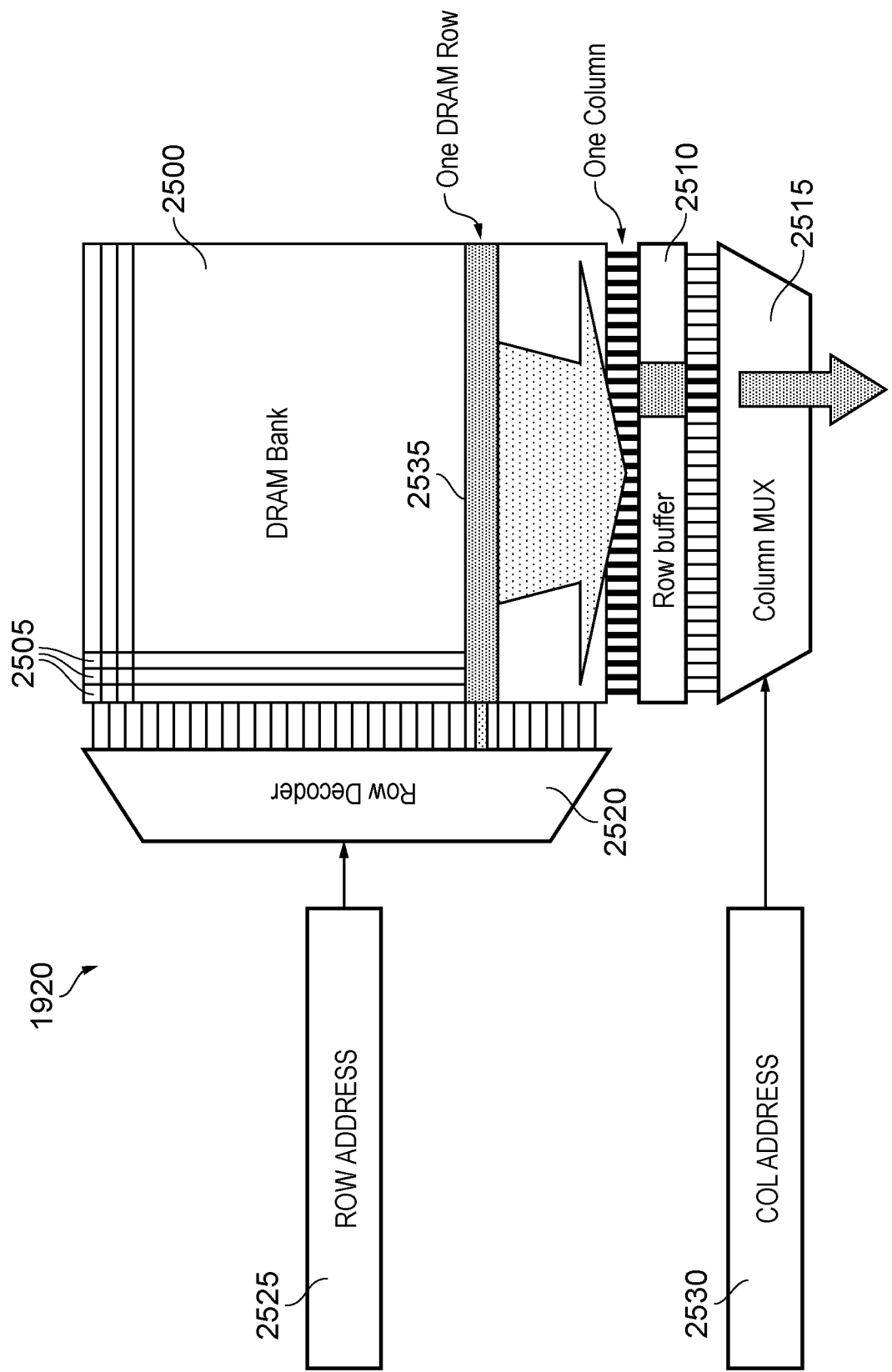
FIG. 25 schematically illustrates a DRAM.

FIG. 25 schematically illustrates aspects of an example arrangement of the DRAM 1920 of FIG. 19, providing an example of a dynamic random access memory to provide the array of storage locations.

The DRAM 1920 comprises an array 2500 of storage locations 2505 arranged in rows and columns, a row buffer 2510, a column multiplexer 2515 and a row decoder 2520. For DRAM, each storage location 2505 comprises a group of bitcells, each bitcell comprising a capacitor which can be selectively charged or discharged to represent a 1 or 0 corresponding to one bit of the overall value represented by the corresponding storage location 2505.

Accesses to the DRAM 1920 are carried out in two stages. First, an activation command specifying a row address 2525 is issued. The row decoder 2520 activates the corresponding row 2535, to bring the information stored in each of the storage locations 2505 of the corresponding row into the row buffer 2510. Second, a column address 2530 accompanies the actual read/write command, which controls the column multiplexer 2515 to select an entry of the row buffer 2510 corresponding to the specified column within the active row, and either output the information read from that entry as read data or update the data in that entry based on write data provided with the write command. For a write operation, writes to the row buffer 2510 may be propagated back to the corresponding storage location 2505 as well. Multiple read/write operations may be performed within the same active row, before the row is closed using a precharge command which closes the connection between the row buffer 2510 and the active row 2535, ensures that the storage locations of the active row 2535 have been updated to reflect any writes to the row buffer 2510, and resets the row buffer 2510 ready for another row to be selected as the active row.

Therefore, an example DRAM-backed translation data buffer as described here comprises: access circuitry (such as the row decoder) to access a selected row and to transfer information from the selected row to the row buffer. In example arrangements the dynamic random access memory is configured to read data in data bursts each of less than one row of entries, and to transmit a part of the row buffer corresponding to a key value. In general, in example arrangements, the DRAM is configured to communicate data in data bursts, and to only transmit the part of the row buffer corresponding to the provided key. Note that the term "bursts" describes how the DRAM communicates rather than how it reads data from the data array. This technique can be used to output the required data after a key has been matched.

Figure 26:
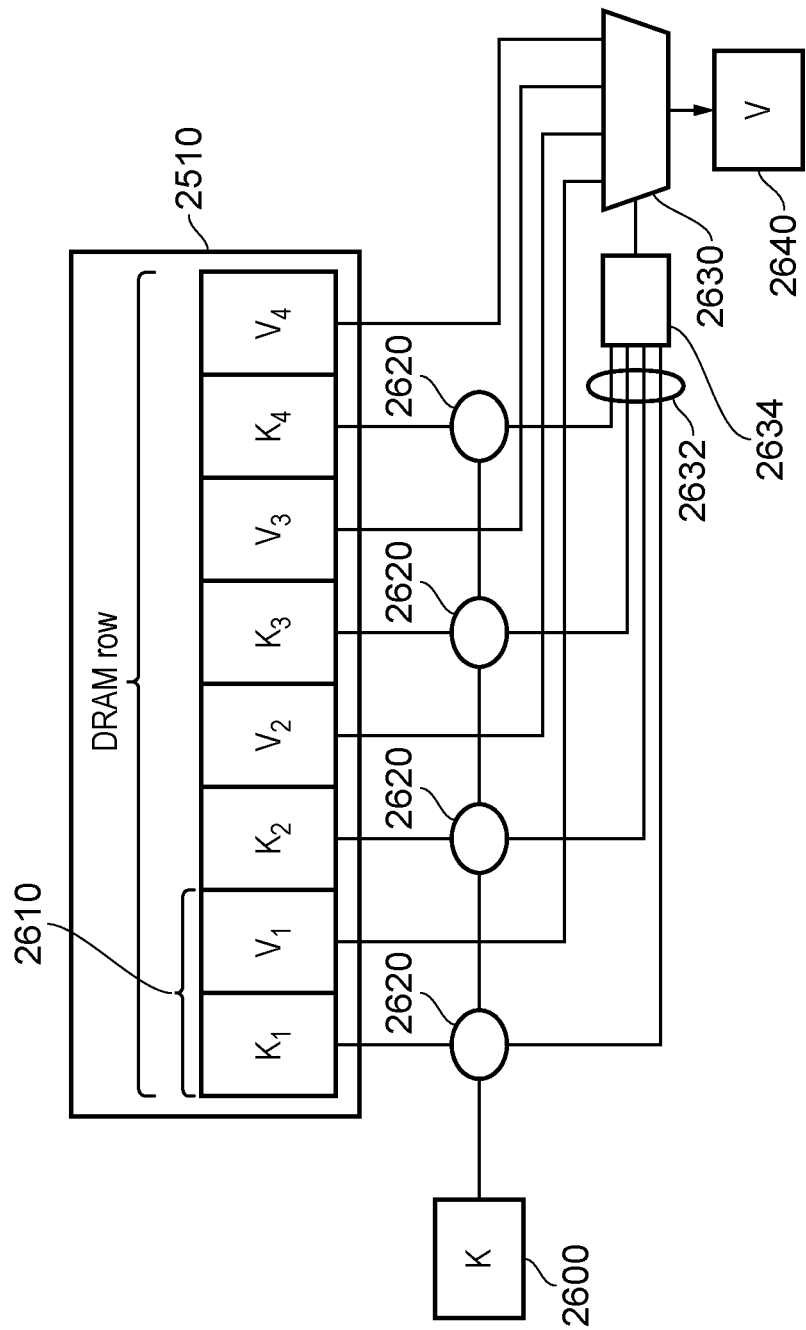
FIG. 26 schematically illustrates data storage in the DRAM of FIG. 25.

FIG. 26 schematically illustrates the operation of a technique for retrieving translation data from the memory of FIG. 25, and in particular from the row buffer 2510 which in this context has been loaded with data retrieved from an active row 2535 of the memory from FIG. 25 and comprises a plurality of entries to store information from a respective portion of a row of the memory array.

A key value 2600 depends upon at least the virtual memory address to be translated. The row buffer contains multiple sets of key, value data such as a set 2610. Each key value in the row buffer $K_1$, $K_2$, $K_3$, $K_4$ is associated with a respective value entry $V_1$, $V_2$, $V_3$, $V_4$. By deriving the new key value 2600 using the same dependence upon the virtual memory addresses as the stored key values $K_1 \ldots K_4$, comparison circuitry 2620 can compare the key value 2600 with information stored in at least one key entry $K_1 \ldots K_4$ of the row buffer 2510, each key entry having an associated value entry $V_1 \ldots V_4$ for storing at least a representation of a corresponding output memory address. In this way, the comparison circuitry 2620 can identify which of the at least one key entry, if any, is a matching key entry storing information matching the key value 2600.

Circuitry 2634 combines the outputs 2632 of the four comparison circuits 2620 into a format to control the operation of output circuitry 2630, which outputs one of the values entries $V_1 \ldots V_4$ under control of the comparison outputs 2632 as an output value 2640 so as to output, when there is a matching key entry, at least the representation of the output memory address in the value entry associated with the matching key entry.

The value entry provides the required translation as discussed below with reference to FIG. 27.

Therefore, FIG. 26 taken in conjunction with FIGS. 19, 20 and 25 provides an example of memory address translation apparatus 1915 comprising: page table access circuitry 2020 to access a page table to retrieve translation data defining an address translation between an initial memory address in an initial memory address space, and a corresponding output memory address in an output address space; a translation data buffer (implemented as 2010, 1920 in the present examples) to store, for a subset of the initial address space, one or more instances of the translation data; the translation data buffer comprising: an array of storage locations 2505 arranged in rows and columns; a row buffer 2510 comprising a plurality of entries 2610 each to store information from a respective portion of a row of the array; and comparison circuitry 2620 responsive to a key value 2600 dependent upon at least the initial memory address, to compare the key value with information stored in each of at least one key entry K1-K4 of the row buffer, each key entry having an associated value entry for storing at least a representation of a corresponding output memory address, and to identify which of the at least one key entry, if any, is a matching key entry storing information matching the key value; and output circuitry 2630 to output, when there is a matching key entry, at least the representation of the output memory address in the value entry V1-V4 associated with the matching key entry K1-K4.

Example embodiments can provide an efficient mechanism for the accessing of translation data in a DRAM-backed translation data buffer using a single memory access, such that a required row (which may be accessed by a hashed initial memory address or in dependence on an portion of the initial memory address for example) is accessed, potentially as a single memory access, and then the contents of that row are compared to a key value dependent upon the initial memory address to detect whether that row contains the required translation. This can potentially reduce the latency and memory traffic to retrieve the translation, as memory accesses to DRAM are potentially relatively slow so it can be advantageous only to need one such access. By providing a key-value arrangement for translation data stored in the memory row, multiple translations can be stored in a row accessed by a single hashed (or other dependency) initial memory address, which can improve the efficiency of storage in the DRAM-backed translation data buffer. In particular, using a hashed or other dependency upon at least a portion of the initial memory address can allow a memory row to be effectively reserved for the initial memory address. In example arrangements the index for the DRAM row is a hash (or part of) (VFN, VMID, ASID) and the same goes for the key. The combination of DRAM row and key should be a unique to a specific tuple (VFN, VMID, ASID). The example of a hashed value allows the distribution of memory rows relative to initial memory addresses to be randomised (or pseudo-randomised). If the memory row is full (because potentially other initial memory addresses can also point there) and a new translation needs to be stored (for example when the translation data for the input virtual memory address is not currently held by the translation data buffer, so that the control circuitry is configured to store the translation data for the input virtual memory address, received from the page table access circuitry, in the translation data buffer) then a victim deletion circuitry can be used to select a key entry and associated value entry in the selected row for overwriting (for example, a replacement policy based on information stored in the row itself or in a different memory or memory region under the control of the memory controller) in response to a detection by the detector circuitry that the selected row has insufficient unused capacity to store the translation data (for example, using the same hashing/dependency to select a row as in the reading operation, thereby providing unused key and value entries in the selected row. Example selection criteria can comprise one or more selected from the list consisting of least recently accessed key value and matching entry; a random or pseudorandom selection of a key value and matching entry; a not most recently accessed key value and matching entry; and a first-in-first-out selection for the selected row.

In example arrangements, the key value can be dependent upon one or more selected from the list consisting of: data indicating a virtual machine requesting the translation; data indicating an initial address space amongst plural virtual address spaces; and data indicating the initial address for which the translation is requested. Therefore, using these techniques the key value can define the required translation provided by the associated value.

Figure 27:
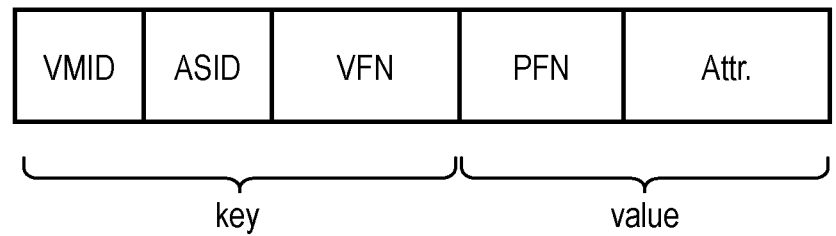
FIG. 27 schematically illustrates a key-value pair.
Figure 28:
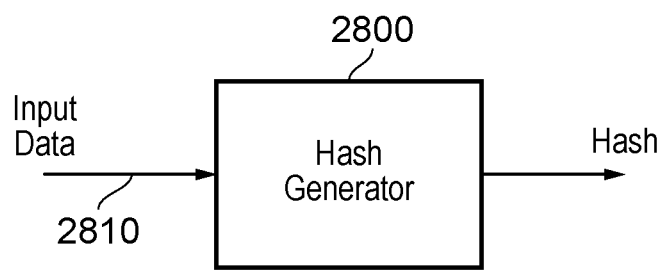
FIG. 28 schematically illustrates a hash generator.

FIG. 27 schematically illustrates a key, value pair, in which the key comprises a concatenation of at least a part of a virtual machine identifier (VMID), an address space identifier (ASID), a virtual frame number (VFN) defining the initial memory address at least to a resolution of a frame or page size, and the value comprises in this example a concatenation of a physical frame number defining the output address at least to the resolution of a frame or page size and also in these examples one or more attributes defining read/write/execute or other example permissions or the like associated with the translation. Therefore, the key value is, in example embodiments, dependent upon one or more selected from the list consisting of: data indicating a virtual machine requesting the translation; data indicating a virtual address space amongst plural virtual address spaces; and data indicating the virtual address for which translation is required.

Example data sizes for these fields are as follows:

| Field | Size (bits) | Key, value sizes |
|---|---|---|
| VMID | 16 | Key 68 |
| ASID | 16 | |
| VFN | 36 | |
| PFN | 36 | Value 60 |
| Attr | 24 | |
| Total | 128 | 128 |

Therefore, each key-value pair occupies in (for example) 16 bytes, allowing four such pairs to be stored in an example 64-byte memory row.

In terms of selecting a row of the array of memory locations, a so-called hash generator 2800 (FIG. 28) can be used, so that the translation data buffer comprises row selection circuitry to select a row of the array in dependence upon a portion of the initial memory address; and access circuitry (implemented in the present examples as 2520, FIG. 25) to access the selected row and to transfer information from the selected row to the row buffer 2510. In the particular example given, the row selection circuitry comprises a hash generator such as the hash generator 2800 configured to generate a hash value from input data 2810 representing at least a portion of the virtual memory address so that the row is selected in dependence upon the hash value. As mentioned above, in example arrangements the index for the DRAM row is a hash (or part of) (VFN, VMID, ASID) and the same goes for the key. The combination of DRAM row and key should be a unique to a specific tuple (VFN, VMID, ASID).

Figure 29:
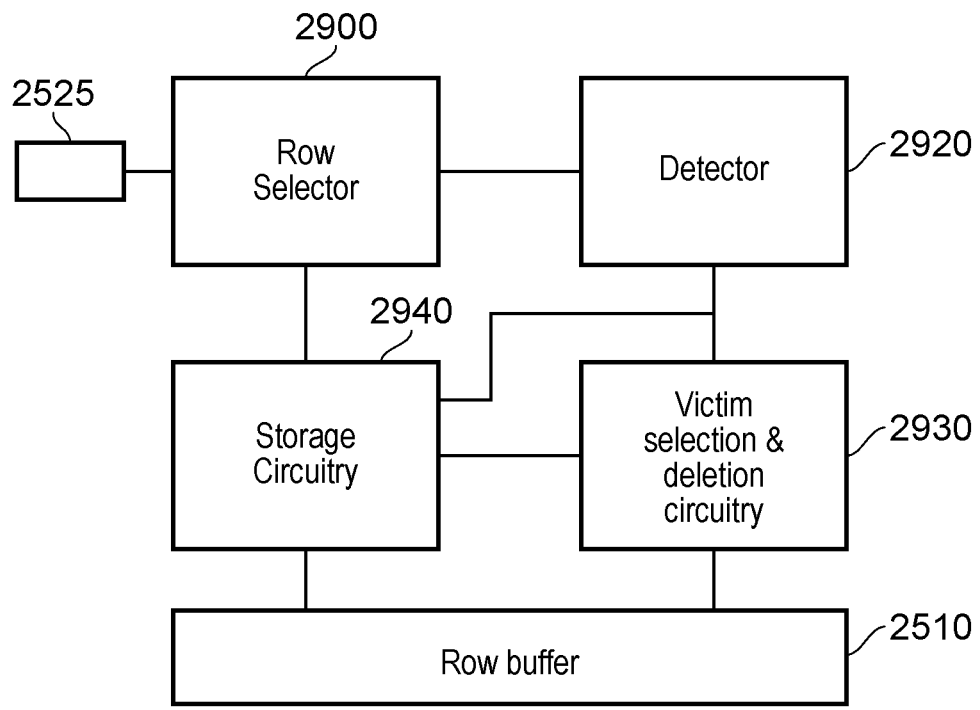
FIG. 29 schematically illustrates write circuitry.

FIG. 29 schematically illustrates circuitry to write data to the memory array providing the DRAM-backed translation data buffer. A write process occurs in situations such as that represented by the step 2360 of FIG. 23, in that, when the translation data for the input virtual memory address is not currently held by the translation data buffer, the control circuitry is configured to store the translation data for the input virtual memory address, received from the page table access circuitry, in the translation data buffer. The arrangement of FIG. 29 attends to this writing in the case that the key-value structure described here is used. The circuitry of FIG. 29 comprises a row selector 2900 using the arrangement of FIG. 28 to select a row and populate the row address 2525 in dependence upon the initial memory address or at least a part of it. This provides an example in which, for storage of translation data in the translation data buffer, the row selection circuitry is configured to select a row of the array in dependence upon at least the portion of the initial memory address for that instance of translation data.

The selected row is moved to the row buffer 2510 for processing. A detector 2920 detects whether all of the (key, entries) in the selected row are occupied and, if so, victim selection and deletion circuitry 2930 selects one of the current entries for deletion using a victim selection process such as deleting the oldest of the current entries. Storage circuitry 2940 writes the new (key, value) pair to the row buffer 2510 and the row buffer is then copied back into the memory array as discussed above.

The example arrangement therefore provides an example of write circuitry 2920, 2930, 2940 to store translation data in the selected row, the write circuitry comprising: detector circuitry 2920 to detect whether the selected row has unused key entries and value entries to store the translation data; victim deletion circuitry 2930 to select a key entry and associated value entry in the selected row for overwriting in response to a detection by the detector circuitry that the selected row has insufficient unused capacity to store the translation data, thereby providing unused key and value entries in the selected row; and storage circuitry 2940 to store the translation data to the unused key and value entries in the selected row. In examples, the victim deletion circuitry is configured to select a key entry and associated value entry according to one or more victim selection criteria selected from the list consisting of: a least recently accessed key value and matching entry. The victim deletion circuitry can actively delete the key value and matching entry so as to make available empty space, or can simply control the overwriting by the new data of the selected data.

Figure 30:
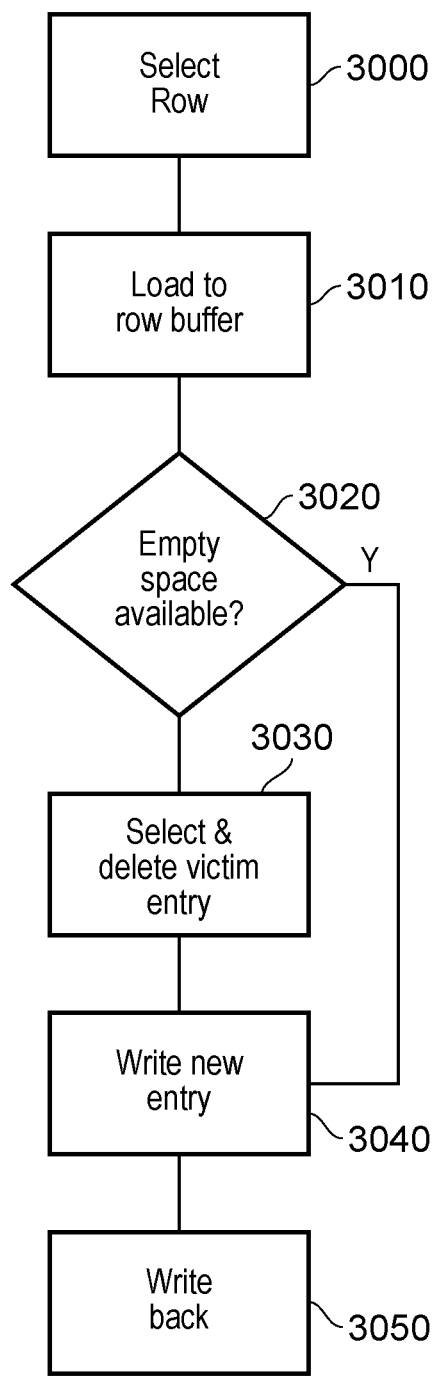
FIGS. 30 and 31 are schematic flowcharts illustrating respective methods.

This process is represented by the schematic flowchart of FIG. 30, in which, at a step 3000 a row is selected according to at least a part of the initial or virtual memory address for the translation. At a step 3010, the contents of that row are loaded to the row buffer 2510. If, at a step 3020 there is empty space available for a key, value pair in the selected row then control passes to a step 3040. Otherwise, at a step 3030, a key, value pair of (victim) is selected for deletion and is deleted. Then, at a step 3040, the new entry is written to the empty space available in the row and at a step 3050, the row is written back to the memory. Note that this write back can be delayed depending on the policy of the DRAM controller. However, it will be written back to the storage array at some point in the future.

Figure 31:
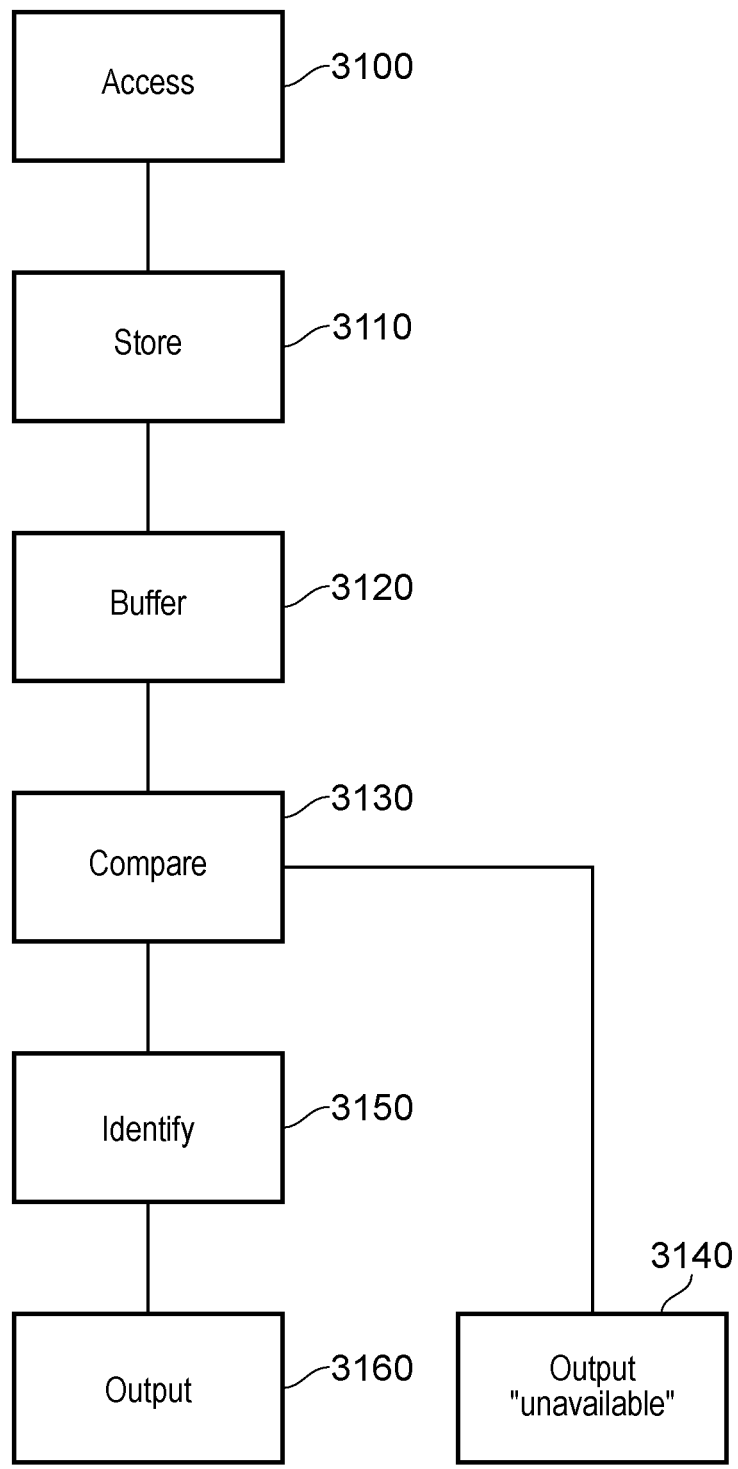

FIG. 31 is a schematic flowchart representing a summary method comprising:

accessing (at a step 3100) a page table to retrieve translation data defining an address translation between an initial memory address in an initial memory address space, and a corresponding output memory address in an output address space;

storing (at a step 3110), in a translation data buffer having an array of storage locations arranged in rows and columns, for a subset of the initial address space, one or more instances of the translation data;

buffering (at a step 3120) a plurality of entries each to store information from a respective portion of a row of the array; and comparing (at a step 3130), in response to a key value dependent upon at least the initial memory address, for comparing the key value with information stored in each of at least one key entry (for example, at least two key entries) of the row buffer, each key entry having an associated value entry for storing at least a representation of a corresponding output memory address.

If as a result of the comparison at the step 3130, the row does not contain the requested translation, then control passes to a step 3140 at which the "valid" signal is set to indicate "unavailable" is set by the controller 2000. Otherwise the method continues as:

identifying (at a step 3150) which of the at least one key entry, if any, is a matching key entry storing information matching the key value; and outputting (at a step 3160), when there is a matching key entry, at least the representation of the output memory address in the value entry associated with the matching key entry.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

The invention claimed is:

1. Memory address translation apparatus comprising:
   page table access circuitry to access a page table to retrieve translation data defining an address translation between an initial memory address in an initial memory address space, and a corresponding output memory address in an output address space;
   a translation data buffer to store, for a subset of the initial memory address space, one or more instances of the translation data;
   the translation data buffer comprising:
   an array of storage locations arranged in rows and columns;
   a row buffer comprising a plurality of entries each to store information from a respective portion of a row of the array; and
   comparison circuitry responsive to a key value dependent upon at least the initial memory address, to compare the key value with information stored in each of at least one key entry of the row buffer, each key entry having an associated value entry for storing at least a representation of a corresponding output memory address, and to identify which of the at least one key entry, if any, is a matching key entry storing information matching the key value; and
   output circuitry to output, when there is a matching key entry, at least the representation of the output memory address in the value entry associated with the matching key entry;
   in which the translation data buffer comprises:
   row selection circuitry to select a row of the array in dependence upon at least a portion of the initial memory address; and
   access circuitry to access the selected row and to transfer information from the selected row to the row buffer.

2. The apparatus of claim 1, in which the row selection circuitry is configured to generate a hash value from at least a portion of the initial memory address and to select the row in dependence upon the hash value.

3. The apparatus of claim 1, in which the key value is dependent upon two or more selected from a list consisting of:
   data indicating an virtual machine requesting the translation;
   data indicating an initial address space amongst plural virtual address spaces; and
   data indicating the initial memory address for which the translation is requested.

4. The apparatus of claim 1, in which, when the translation data for the initial memory address is not currently held by the translation data buffer, the control circuitry is configured to store the translation data for the initial memory address, received from the page table access circuitry, in the translation data buffer.

5. The apparatus of claim 4, in which, for storage of translation data in the translation data buffer, the row selection circuitry is configured to select a row of the array in dependence upon at least the portion of the initial memory address for that instance of translation data.

6. The apparatus of claim 5, comprising write circuitry to store translation data in the selected row, the write circuitry comprising:
   detector circuitry to detect whether the selected row has unused key entries and value entries to store the translation data;
   victim deletion circuitry to select a key entry and associated value entry in the selected row for overwriting in response to a detection by the detector circuitry that the selected row has insufficient unused capacity to store the translation data, thereby providing unused key and value entries in the selected row; and
   storage circuitry to store the translation data to the unused key and value entries in the selected row.

7. The apparatus of claim 6, in which the victim deletion circuitry is configured to select and delete a key entry and associated value entry according to one or more victim selection criteria selected from a list consisting of:
   least recently accessed key value and matching entry;
   a random or pseudorandom selection of a key value and matching entry;
   a not most recently accessed key value and matching entry; and
   a first-in-first-out selection for the selected row.

8. The apparatus of claim 1, comprising a dynamic random access memory to provide the array of storage locations.

9. The apparatus of claim 8, in which the dynamic random access memory is configured to communicate data in data bursts each of less than one row of entries, and to transmit a part of the row buffer corresponding to a key value.

10. Data processing apparatus comprising:
    a memory accessible according to physical memory addresses;
    one or more processing elements to generate virtual memory addresses for accessing the memory; and
    the apparatus of claim 1 to provide a translation of the initial memory addresses generated by the one or more processing elements to physical memory addresses provided to the memory.

11. The data processing apparatus of claim 10, in which the one or more processing elements each comprise a respective translation lookaside buffer to store a set of translation of the initial memory addresses generated by that processing element to physical memory addresses provided to the memory; the translation lookaside buffer being configured to request a translation not stored by the translation lookaside buffer from the memory address translation apparatus.

12. Memory address translation apparatus comprising:
   page table access means for accessing a page table to retrieve translation data defining an address translation between an initial memory address in an initial memory address space, and a corresponding output memory address in an output address space;
   a translation data buffer means for storing, for a subset of the initial memory address space, one or more instances of the translation data;
   the translation data buffer means comprising:
   an array of storage locations arranged in rows and columns;
   row buffer means comprising a plurality of entries each to store information from a respective portion of a row of the array; and
   comparison means responsive to a key value dependent upon at least the initial memory address, for comparing the key value with information stored in each of at least one key entry of the row buffer, each key entry having an associated value entry for storing at least a representation of a corresponding output memory address, and for identifying which of the at least one key entry, if any, is a matching key entry storing information matching the key value; and
   output means for outputting, when there is a matching key entry, at least the representation of the output memory address in the value entry associated with the matching key entry;
   in which the translation data buffer means comprises:
   row selection means for selecting a row of the array in dependence upon at least a portion of the initial memory address; and
   access means for accessing the selected row and for transferring information from the selected row to the row buffer means.

13. A method comprising:
   accessing a page table to retrieve translation data defining an address translation between an initial memory address in an initial memory address space, and a corresponding output memory address in an output address space;
   storing, in a translation data buffer having an array of storage locations arranged in rows and columns, for a subset of the initial memory address space, one or more instances of the translation data;
   buffering a plurality of entries each to store information from a respective portion of a row of the array; and
   comparing, in response to a key value dependent upon at least the initial memory address, for comparing the key value with information stored in each of at least one key entry of the plurality of entries, each key entry having an associated value entry for storing at least a representation of a corresponding output memory address;
   identifying which of the at least one key entry, if any, is a matching key entry storing information matching the key value; and
   outputting, when there is a matching key entry, at least the representation of the output memory address in the value entry associated with the matching key entry;
   in which the buffering step comprises:
   selecting a row of the array in dependence upon at least a portion of the initial memory address;
   accessing the selected row; and
   buffering information from the selected row.

* * * * *